(12) United States Patent
Weldon

(10) Patent No.: US 6,943,628 B2
(45) Date of Patent: Sep. 13, 2005

(54) METHODS AND APPARATUS FOR SUBSTANTIALLY REDUCING NONLINEAR DISTORTION

(75) Inventor: Thomas Paul Weldon, Charlotte, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 10/793,999

(22) Filed: Mar. 5, 2004

(65) Prior Publication Data

US 2004/0251964 A1 Dec. 16, 2004

Related U.S. Application Data

(62) Division of application No. 10/101,005, filed on Mar. 19, 2002, now Pat. No. 6,794,938.

(51) Int. Cl.⁷ .................................................. H03F 1/26
(52) U.S. Cl. ....................................... 330/149; 330/151
(58) Field of Search ................................ 330/149, 151, 330/124 R, 295; 375/297; 455/63

(56) References Cited

U.S. PATENT DOCUMENTS

| | | |
|---|---|---|
| 4,379,994 A | 4/1983 | Bauman |
| 4,447,790 A * | 5/1984 | Fukuda et al. .............. 330/149 |
| 4,533,105 A | 8/1985 | Cornwell, Jr. et al. |
| 4,879,519 A | 11/1989 | Myer |
| 4,926,136 A | 5/1990 | Olver |
| 5,051,704 A | 9/1991 | Chapman et al. |

(Continued)

OTHER PUBLICATIONS

Haideh Khorramabadi, Paul R. Gray; *High Frequency CMOS Continuous–Time Filters; IEEE Journal of Solid-State Circuits*; Dec. 1984; pp. 939–948; vol. SC–19, No. 6.

Scott T Dupuie, Mohammed Ismail; *High Frequency CMOS Transconductors, Analogue IC design the current–mode approach*; 1990; Chapter 5, pp. 181–193, 230–233; Peter Peregrins Ltd. on behalf of the Institution of Electrical Engineers; United Kingdom; ISBN 0–86341–215–7.

(Continued)

*Primary Examiner*—Henry Choe
(74) *Attorney, Agent, or Firm*—Alston & Bird LLP

(57) ABSTRACT

Methods and apparatus are provided for substantially reducing and/or canceling nonlinearities of any order in circuits, devices, and systems such as amplifiers and mixers. In particular, methods and apparatus are provided for substantially reducing and/or canceling third order nonlinearities in circuits, devices, and systems such as amplifiers and mixers. A first coupler is used to split an input signal into two equal-amplitude in-phase components, each component is processed by two nonlinear devices with different nonlinearities, and a final combiner, such as a 180-degree hybrid, recombines the processed signals 180 degrees out of phase and substantially reduces and/or cancels the undesired nonlinear distortion components arising due to nonlinearities in the nonlinear devices.

27 Claims, 21 Drawing Sheets

U.S. PATENT DOCUMENTS

| | | |
|---|---|---|
| 5,117,197 A | 5/1992 | Hsu et al. |
| 5,146,190 A | 9/1992 | Firmain |
| 5,151,664 A | 9/1992 | Suematsu et al. |
| 5,157,345 A | 10/1992 | Kenington et al. |
| 5,157,346 A | 10/1992 | Powell et al. |
| 5,170,392 A | 12/1992 | Riordan |
| 5,237,332 A | 8/1993 | Estrick et al. |
| 5,334,946 A | 8/1994 | Kenington et al. |
| 5,339,454 A | 8/1994 | Kuo et al. |
| 5,489,875 A | 2/1996 | Cavers |
| 5,564,094 A | 10/1996 | Anderson et al. |
| 5,574,967 A | 11/1996 | Dent et al. |
| 5,623,227 A | 4/1997 | Everline et al. |
| 5,697,081 A | 12/1997 | Lyall, Jr. et al. |
| 5,758,271 A | 5/1998 | Rich et al. |
| 5,760,646 A | 6/1998 | Belcher et al. |
| 5,774,018 A | 6/1998 | Gianfortune et al. |
| 5,877,653 A | 3/1999 | Kim et al. |
| 5,917,375 A | 6/1999 | Lisco et al. |
| 5,977,826 A | 11/1999 | Behan et al. |
| 5,994,957 A | 11/1999 | Myer |
| 6,044,253 A | 3/2000 | Tsumura |
| 6,052,566 A | 4/2000 | Abramsky et al. |
| 6,069,531 A * | 5/2000 | Myer .................. 330/151 |
| 6,100,757 A | 8/2000 | Kotzamanis |
| 6,104,919 A | 8/2000 | Lyall, Jr. et al. |
| 6,198,346 B1 | 3/2001 | Rice et al. |
| 6,208,207 B1 | 3/2001 | Cavers |
| 6,208,849 B1 | 3/2001 | Cho et al. |
| 6,242,979 B1 | 6/2001 | Li |
| 6,545,535 B2 * | 4/2003 | Andre .................. 330/149 |
| 2002/0126767 A1 | 9/2002 | Ding |
| 2003/0045264 A1 | 3/2003 | Jeong et al. |

OTHER PUBLICATIONS

Bo Shi, Lars Sundström; *A Novel Design Using Translinear Circuit for Linear Linc Transmitters*; May 28–31, 2000; pp. I–64—I–67; ISCAS 2000—IEEE International Symposium on Circuits and Systems; Geneva Switzerland; 0–7803–5482–6/99; 2000 IEEE.

Scott A. Olson, Robert E. Stengel; *LINC Imbalance Correction using Baseband Preconditioning*; 1999; pp. 179–182; Motorola Labs, Motorola Inc., Plantation Florida; 0–7803–5454–099; 1999 IEEE.

Sachihiro Toyoda; *Broad–Band Push–Pull Power Amplifier*; Osaka Institute of Technology, Osaka, Japan; 1990; pp. 507–510; CH2848–0/90/0000; 1990 IEEE MTT–S Digest.

* cited by examiner

500

510 — Splitting an input signal at an input coupling means into first and second in-phase coupled signals. The ratio of the second coupled signal power, $p_2$, to the first coupled signal power, $p_1$, is $K = 10\log_{10}(p_2/p_1)$ dB, with $p_1$ and $p_2$ in milliwatts.

520 — Processing the first coupled signal at a first nonlinear device and the second coupled signal at a second nonlinear device. The first nonlinear device having a gain, $G_1$ dB and a third order output intercept point $OIP3_1$ dBm. The second nonlinear device having a gain, $G_2$ dB and a third order output intercept point $OIP3_2$ dBm. The relationship of the first and second nonlinear devices and the coupling means being most nearly $2(OIP3_1 - OIP3_2) = 3(G_1 - G_2 - K)$, where $G_1$ is not equal to $G_2 + K$.

530 — Subtracting the output signal of the second nonlinear device from the output signal of the first nonlinear device to yield a final output signal that substantially reduces third order nonlinear distortion.

Fig. 5

METHODS AND APPARATUS FOR SUBSTANTIALLY REDUCING NONLINEAR DISTORTION

CROSS-REFERENCE TO RELATED APPLICATIONS

This application is a divisional of U.S. application Ser. No. 10/101,005, filed Mar. 19, 2002 now U.S. Pat. No. 6,794,938.

FIELD OF THE INVENTION

The present invention relates to electronic circuits, devices, and systems and the linearization of nonlinearites inherent in such devices and, more specifically, the present invention relates to methods and apparatus for reduction, cancellation, and enhancement of nonlinearities of electronic devices.

BACKGROUND OF THE INVENTION

Circuit and device nonlinearities are well known in the art to create undesired intermodulation distortion. In many applications, these nonlinearities and associated intermodulation distortion of circuits and devices limit the performance of systems and often lead to designs with increased power consumption in efforts to avoid intermodulation distortion. Example applications include the receiver and transmitter portions of cellular phone handsets, base stations, cable television head-ends, cable television amplifiers, and general purpose amplifiers. In receivers, the presence of strong undesired signals, typically at nearby frequencies, can produce intermodulation products that interfere with the reception of weak desired signals. In transmitters, intermodulation distortion can lead to the generation of undesired frequency emissions that violate regulatory requirements and interfere with other services, typically at nearby frequencies.

For example, in cellular phones the problem of receiving weak signals in the presence of strong signals is of considerable interest. It is common for a cellular phone to be situated far from a base-station antenna tower (leading to a weak desired signal from the tower) while other strong signals such as nearby cellular phones, television transmitters, radar and other radio signals interfere with the reception of the desired weak signal. This interference is further exacerbated by nonlinearities within electronic circuits, including third order nonlinearities that are well known in the art to limit the performance of circuits and devices.

In addition to the problems created by nonlinearities in radio receivers, radio transmitters are similarly affected by third-order and other nonlinearities. Such nonlinearities in transmitters lead to undesired transmitter power in frequency bands outside the desired transmission frequency bands, such effects being commonly referred to as spectral re-growth in the art. These out-of-band signals in radio transmitters can violate regulatory emission requirements and cause interference with other users operating at nearby frequencies.

In broadband systems, such as cable television, nonlinearities present particular problems since such systems have a plurality of signals (i.e., television signals) at relatively high power levels. This plurality of signals, combined with relatively high power levels, can lead to particular sensitivity to channel-to-channel interference problems induced by nonlinearities in broadband and cable television applications.

In addition, it is well known in the art that nonlinearities are also used in a beneficial manner to achieve desired effects, and in such cases enhancement of the nonlinearities is the desired outcome. Example applications where such enhancement of nonlinearities is desirable are harmonic mixers and frequency multipliers.

The nonlinearities of devices, such as amplifiers, are commonly modeled as Taylor series expansions, i.e., power series expansions or polynomial expansions, of an input signal. For example, the output voltage y of a device may be described as a Taylor series, or polynomial, expansion of the input voltage x:

$$y = a_0 + a_1 x + a_2 x^2 + a_3 x^3 + \ldots$$

where $a_0$, $a_1$, $a_2$, $a_3$ ... are constants representative of the behavior of the particular device being modeled, and the order of the polynomial is determined by the highest power of x in the polynomial expansion. In most situations, the linear term $a_1 x$ is the desired linear signal, and the terms $a_n x^n$, with $n \neq 1$, are undesired. The term $a_0$ represents a constant, or DC (direct current), offset that is easily removed in most applications.

In radio applications, the term $a_3 x^3$ is particularly problematic when an input signal such as $x = A \cos(\omega_1 t) + A \cos(\omega_2 t)$ is considered. In this case the cubic term of the Taylor series is defined as:

$$a_3 x^3 = a_3 A^3 [\cos^3(\omega_1 t) + 3\cos^2(\omega_1 t)\cos(\omega_2 t) + 3\cos(\omega_1 t)\cos^2(\omega_2 t) + \cos^3(\omega_2 t)]$$

where the terms $\cos^2(\omega_1 t)\cos(\omega_2 t)$ and $\cos(\omega_1 t)\cos^2(\omega_2 t)$ can be further expanded to:

$$\cos^2(\omega_1 t)\cos(\omega_2 t) = \frac{1}{4}[2\cos(\omega_2 t) + \cos(2\omega_1 t + \omega_2 t) + \cos(2\omega_1 t - \omega_2 t)]$$

$$\cos(\omega_1 t)\cos^2(\omega_2 t) = \frac{1}{4}[2\cos(\omega_1 t) + \cos(2\omega_2 t + \omega_1 t) + \cos(2\omega_2 t - \omega_1 t)]$$

where the terms $\cos(2\omega_1 t - \omega_2 t)/4$ and $\cos(2\omega_2 t - \omega_1 t)/4$ are well known in the art to present particular difficulty in the design of communications equipment since they can produce undesired in-band distortion products at frequencies close to the desired linear signal frequencies. For example, at frequencies of $f_1 = 100$ MHz and $f_2 = 100.1$ MHz, with $\omega_1 = 2\pi f_1$ and $\omega_2 = 2\pi f_2$, the undesired frequency component $2\omega_1 - \omega_2$ is a frequency of 99.9 MHz and $2\omega_2 - \omega_1$ is a frequency of 100.2 MHz. These two undesired frequencies at 99.9 and 100.2 MHz are created by the third-order nonlinearity of the polynomial (i.e., $a_3 x^3$), and are so close to the desired linear signal frequencies of 100 and 100.1 MHz that they cannot easily be removed by filtering.

One prior art approach to the problem employs feedforward compensation wherein a distortion error signal is generated by taking the difference between a first amplified and distorted signal, and a second undistorted signal, and later subtracting the distortion error signal from the first amplified and distorted signal in order to remove the distortion components.

This prior art is illustrated in the schematic drawing of FIG. 1, in which an apparatus 10 incorporating feedforward compensation is shown by way of example. An input signal 12 is applied both to first amplifier 14 and a first delay device 16. The time delay of the first delay device equals the time delay of the first amplifier. The output signal 18 of the first amplifier is attenuated by the attenuator 20. The output signal 22 of the first delay device is subtracted from the output signal 24 of the attenuator in a first subtractor 26 resulting in error signal 28. The output signal 18 of the first amplifier is also input to a second delay device 30. The time delay of the second delay device equals the time delay of the second amplifier 32 that amplifies the error signal. The output signal 34 of the second amplifier is subtracted from the output signal 36 of the second delay in a second subtractor 38 to form the final output signal 40.

For illustrative purposes, an example input frequency spectrum 42 is shown for input signal 12 comprised of two input spectral lines of equal amplitude at different frequencies. The spectrum at the output signal 18 of the first amplifier 14 is illustrated in second spectrum 44 where the two innermost spectral lines correspond to the original input frequencies illustrated in the input spectrum, but with larger amplitude, and the two outermost spectral lines representing third-order distortion components of the output signal 18 of the first amplifier. The spectrum at the error signal 28 is illustrated in third spectrum 46 where the two spectral lines correspond to an attenuated version of the third-order distortion components of the second spectrum 44 (the two outermost spectral lines in the second spectrum). In the third spectrum the attenuation of attenuator 20 has adjusted the signal to completely eliminate the two innermost spectral components of the second spectrum. The spectrum at the output signal 34 of the second amplifier 32 is illustrated in fourth spectrum 48 where the two spectral lines correspond to an amplified version of the third spectrum, where the amplitude of the spectral components in the fourth spectrum equals the amplitude of the two outermost spectral components of the second spectrum. The spectrum at the final output signal 40 is illustrated in the fifth spectrum 50 where the two spectral lines correspond to an amplified version of the input frequency spectrum and all distortion products in the second spectrum (the two outermost spectral lines in second spectrum) are canceled and eliminated.

For examples similar to the one illustrated in FIG. 1, see, U.S. Pat. No. 5,489,875, issued on Feb. 6, 1996, in the name of inventor Cavers, which describes an adaptive version of this well-known scheme, and a similar scheme is described in U.S. Pat. Nos. 5,157,346, and 5,323,119, issued on Oct. 20, 1992 and Jun. 21, 1994, respectively, in the name of inventors Powell et al. Similar approaches are disclosed in U.S. Pat. No. 4,379,994, Bauman, issued Apr. 12, 1983; U.S. Pat. No. 4,879,519, Myer, issued Nov. 7, 1989; U.S. Pat. No. 4,926,136, Olver, issued May 15, 1990; U.S. Pat. No. 5,157,346, Powell et al., issued Oct. 20, 1992; U.S. Pat. No. 5,334,946, Kenington, issued Aug. 2, 1994; and U.S. Pat. No. 5,623,227, Everline et al., issued Apr. 22, 1997.

However, these prior art approaches require delay lines, of considerable physical size, to compensate for delay through the amplifiers. These approaches also require the availability of undistorted reference signals and further rely on accurate generation of the distortion error signal. In many applications the undistorted signal may not be available or may be of such a small power level as to be unusable in prior art applications. A further disadvantage of the prior art is that said distortion error signal contains amplified noise components of the amplified and distorted signal that can degrade the noise of the overall system, making the prior art unattractive for application in low noise systems such as radio receivers. In addition, the prior art approaches relate more directly to power amplifier devices because of the aforesaid limitations. Therefore, a need exists to substantially reduce and/or cancel nonlinearities without the need for delay lines, without the need for undistorted reference signals, and without the need for a distortion error signal, such distortion error signal containing only distortion components and not containing components of the undistorted signal.

A second prior art approach to the problem employs push-pull compensation as shown in FIG. 2. As shown the apparatus 60 comprises a first hybrid splitter 62, first and second amplifiers 64, 66 and a second hybrid splitter 68 that functions as a combiner. An input signal 70 is first split into first and second coupled signals 72 and 74 by first hybrid splitter 62, wherein the second coupled signal is 180 degrees out of phase with the first coupled signal. As is well known in the art, the fourth port of both the first and second hybrid splitters are properly terminated with impedance matched terminating loads 76 and 78. The first coupled signal is input to the first amplifier 64 and the second coupled signal is input to the second amplifier 66, with the first and second amplifiers being identical. The input-output relationship of the first and second amplifier, being identical, may be approximated by a Taylor, or power, series. For illustration, let $a_0$ be zero in the Taylor series, and consider terms up to the fourth order. Then, denote the first coupled signal 72 to the first amplifier 64 as x, and denote the first output signal 80 of the first amplifier 64 as $y_1$. The first output signal 80 of the first amplifier 64 can then be approximated as:

$$y_1 = a_1 x + a_2 x^2 + a_3 x^3 + a_4 x^4$$

Since the second coupled signal 74, being the input of the second amplifier 66 is 180 degrees out of phase with the first coupled signal 72 of the first amplifier 64, the second coupled signal 74 as input of the second amplifier 66 may be expressed as $-x$, i.e., the negative of the first coupled signal of the first amplifier. Accordingly, denote the second coupled signal 74 as $-x$ and denote the second output signal 82 of the second amplifier 66 as $y_2$. Then, the second output signal 82 of the second amplifier 66 can then be approximated as:

$$y_2 = -a_1 x + a_2 x^2 + -a_3 x^3 + a_4 x_4$$

The final output signal 84 is formed by combining the two amplifier signals in a second hybrid splitter 68, with a 180-degree phase shift of the second output signal 82 and with 0 degree phase shift of the first output signal 80, effectively subtracting the second output signal 82 from the first output signal 80 to form the final output signal 84, to within a multiplicative constant, $1/\sqrt{2}$, relating to the impedances of the ports, as is well known in the art. Using the foregoing notation, and denoting the final output signal 84 as $y_3$, the final output signal is defined as:

$$y_3 = \frac{1}{\sqrt{2}}(y_1 - y_2) = \frac{1}{\sqrt{2}}(2a_1 x + 2a_3 x^3)$$

where the multiplicative factor $1/\sqrt{2}$ is included for power conservation in the common case where the second hybrid splitter 68 is a passive radio-frequency circuit, and all four ports have the same impedance. The desired linear component of the final output signal 84 is the linear term in the Taylor series expansion, represented in the term $2a_1 x/\sqrt{2}$ in the expression for $y_3$ above. As is well known in the art, the even order distortion terms, or nonlinearities, present in the amplifier output signals $y_1$ and $y_2$, i.e., the $a_2 x^2$ and $a_4 x^4$ terms in the Taylor series expansion, are eliminated in the final output signal 84. However, the odd order distortion terms, or nonlinearities, such as the $2a_3 x^3/\sqrt{2}$ term in the expression for $y_3$ above, are not eliminated in the final output signal 84. In addition, the method requires two identical amplifiers. Therefore, a need exists to develop methods and apparatus to eliminate odd order nonlinearities, such as the $a_3 x^3$ and $a_5 x^5$ terms in the Taylor series expansion of nonlinear circuits, devices, and systems.

Other prior art approaches use an attenuator or automatic gain control to reduce signal levels, thus resulting in reduction of third-order distortion at a rate faster than reduction of the desired signal levels (due to the cubic term in the Taylor series expansion). See for example, U.S. Pat. No. 4,553,105, Sasaki, issued Nov. 12, 1985; U.S. Pat. No. 5,170,392, Riordan, issued Dec. 8, 1992; U.S. Pat. No. 5,339,454, Kuo et al., issued Aug. 16, 1994; U.S. Pat. No. 5,564,094, Anderson et al., issued Oct. 8, 1996; U.S. Pat. No. 5,697,081, Lyall, Jr. et al., issued Dec. 9, 1997: U.S. Pat. No. 5,758,271, Rich et al., issued May 26, 1998; U.S. Pat. No. 6,044,253, Tsumura, issued Mar. 28, 2000; U.S. Pat. No. 6,052,566, Abramsky et al., issued Apr. 18, 2000; U.S. Pat. No. 6,104,919, and Lyall Jr. et al., issued Aug. 15, 2000. Such approaches employing an attenuator or automatic gain control to reduce signal levels are not generally useful in receiver applications where the attenuation can reduce signal-to-noise ratio of the desired signal, and such approaches are undesirable in transmitter applications where it is desirable for power efficiency purposes to drive the power amplifier at or near the rated output power capacity.

In U.S. Pat. No. 5,917,375, issued on Jun. 29, 1999, in the name of inventors Lisco et al., delay lines and phase shifters are used to produce in-phase desired signals with out-of phase third-order distortion signals, which when added together result in cancellation of the third-order distortion signals. A desired method and apparatus for cancellation of the third-order distortion will eliminate the phase-shift and delay methods taught in the Lisco et al. '375 patent, and will not require the generation of in-phase desired signals components in conjunction with out-of phase third-order distortion signal components.

In other patents, U.S. Pat. No. 5,151,664, issued in the name of inventors Suematsu et al, on Sep. 29, 1992, requires an envelope detection circuit. U.S. Pat. No. 5,237,332, issued in the name of inventors Estrick et al, on Aug. 17, 1993 requires a cubing circuit that generates only the cubic terms of the Taylor series and requires an analog to digital conversion and complex weight and calibration signal. U.S. Pat. No. 5,774,018, issued in the name of inventors Gianfortune et al., on Jun. 30, 1998, requires a predistorter and delay line and is designed for large-signal power amplifier application. Additional methods and apparatus are disclosed in U.S. Pat. No. 5,877,653, issued in the name of inventors Kim et al., on Mar. 2, 1999 that requires predistortion, delay lines, employs the aforementioned variable attenuator methods, and also requires an undistorted reference signal.

Alternate methods and devices are taught in U.S. Pat. No. 5,977,826, issued in the name of inventors Behan et al., on Nov. 2, 1999, which requires a test signal and vector modulator. U.S. Pat. No. 5,994,957, issued in the name of inventor Myer, on Nov. 30, 1999 teaches required delay lines and predistortion circuit. U.S. Pat. No. 6,198,346, issued in the name of inventors Rice et al., on Mar. 6, 2001 requires multiple feedforward loops, delay lines and phase shifters. U.S. Pat. No. 6,208,207, issued in the name of inventor Cavers, on Mar. 27, 2001 requires three parallel signal paths, delay lines, and complex gain adjusters. U.S. Pat. No. 5,051,704, issued in the name of inventors Chapman et al., on Sep. 24, 1991, requires a pilot signal and least means square circuit. U.S. Pat. No. 5,760,646, issued in the name of inventors Belcher et al., requires a predistortion modulator.

Therefore, a need exists to develop methods and apparatus to substantially reduce and/or cancel nonlinearities in circuits, devices, and systems. In particular a desired need exists to reduce, remove, cancel, and eliminate odd order nonlinearities, such as the $a_3x^3$ and $a_5x^5$ terms in the Taylor series expansion of nonlinear circuits, devices, and systems. This need is especially apparent in radio communication systems such as cellular phones and in other related technical areas. The methods and apparatus should be capable of the necessary function without the need to incorporate delay lines, undistorted reference signals and distortion error signals. Additionally, the means for reducing, canceling, eliminating or enhancing nonlinearities should be able to accomplish such with minimal adverse effect on noise figure and with minimal added noise.

Additionally, a specific need exists to reduce, remove, cancel, and eliminate third order nonlinearities from circuits, devices, and systems, in particular amplifier circuits. Such reduction, removal and cancellation of nonlinear distortions will result in desired high quality amplification of signals. A more general need exists to reduce, remove, cancel, and eliminate any order nonlinearity from circuits, devices, and systems, such as amplifiers, mixers or the like.

Also, in those applications in which nonlinearities are used to achieve desired effects, enhancement of the nonlinearities is desired to improve such devices and systems.

The desired means for reducing, canceling, eliminating and/or enhancing nonlinearities should be cost effective, thus eliminating the need to implement costly high power devices such as amplifiers and mixers to achieve lowered levels of nonlinear distortion. Additionally, the desired means for reducing, canceling, eliminating and/or enhancing nonlinearities should provide for reduced power consumption, thus reducing the high power consumption typically associated with prior art high power devices such as amplifiers and mixers required to achieve lowered levels of nonlinear distortion.

Another desired aspect of the means for reduction, cancellation, elimination and/or enhancement of the nonlinearities is to incorporate an adaptive means of reducing or canceling the nonlinear distortions, wherein the parameters of the methods used to affect reduction, cancellation, elimination or enhancement can be adjusted to effect cancellation of undesired nonlinearities.

A need exists to develop means and methods for reducing or canceling nonlinear distortions in integrated circuit implementations where devices and components used in integrated circuits, such as amplifiers and mixers, can be accurately fabricated so as to effect reduction or cancellation of undesired nonlinearities. Examples of such integrated circuit devices include metal oxide field effect transistors, GaAs field effect transistors, bipolar transistors, diodes, and the like. In particular, if the performance of one integrated circuit device changes from batch-to-batch or from chip-to-chip, the second integrated circuit device, being integrated on the same chip, will typically have performance in track with the first integrated circuit device, preserving the desired reduction or cancellation. As is well known in the art, scaling of devices on integrated circuits can be done accurately, permitting the control of relative parameters of devices and allowing effective integrated circuit implementation.

SUMMARY OF THE INVENTION

The present invention includes apparatus and methods for substantially reducing and/or canceling nonlinearities in circuits, devices, and systems. In particular the present invention substantially reduces and/or cancels odd order nonlinearities, such as the $a_3x^3$ and $a_5x^5$ terms in the Taylor series expansion of nonlinear circuits, devices, and system. The apparatus and methods of the present invention substantially reduce and/or cancel nonlinearities without the need to incorporate delay lines, undistorted reference signals and distortion error signals. Additionally, the present invention substantially reduces and/or cancels nonlinearities with minimal adverse effect on noise figure and with minimal added noise. Specifically, the present invention provides means for reducing and/or canceling third order nonlinearities in circuits, devices, and systems, in particular amplifier or mixer circuits.

The present invention provides substantial reduction and/or cancellation of nonlinearities in a cost-effective manner, thus eliminating the need in current prior art to implement costly high power devices such as amplifiers and mixers to achieve lowered levels of nonlinear distortion. Additionally, the present invention provides means of substantially reducing and/or eliminating nonlinearities with reduced power consumption, thus reducing the high power consumption typically associated with prior art high power devices such as amplifiers and mixers required to achieve lowered levels of nonlinear distortion.

A first embodiment of the invention, an apparatus for substantially reducing and/or canceling nonlinear distortion, includes a first coupler having an input and first and second outputs. The first coupler is capable of splitting an input signal into first and second coupled signals having equal amplitude and in-phase with respect to each other. The apparatus also includes a first nonlinear device having an input in communication with the first output of the first coupler and an output and a second nonlinear device having an input in communication with the second output of the first coupler and an output. The nonlinear device will typically comprise an amplifier, a mixer or the like, with substantially equal time delay and phase. The apparatus also includes a second coupler having a first input in communication with the output of the first nonlinear device, a second input in communication with the output of the second nonlinear device and an output. The second coupler is capable of 180-degree phase shifting an output signal of the second nonlinear device and coupling the phase shifted output signal of the second nonlinear device with an output signal of the first nonlinear device to generate a final output signal.

In this embodiment the second nonlinear device will typically have a different gain and a different third order intercept point than the first nonlinear device. As such, the gain of the first nonlinear device, the gain of the second nonlinear device, the predetermined nonlinearity of the first nonlinear device and the predetermined nonlinearity of the second nonlinear device are predetermined to substantially reduce and/or cancel the predetermined nonlinearity of order n.

This embodiment may also be defined in terms of the following equation, in which, the gain of the first nonlinear device is defined as $G_1$, the gain of the second nonlinear device is defined as $G_2$, the third order output intercept point of the first nonlinear device is defined as $OIP3_1$ and the third order output intercept point of the second nonlinear device is $OIP3_2$ such that the first and second nonlinear devices are provided with substantially equal time delay and phase such that $2(OIP3_1-OIP3_2)=3(G_1-G_2)$, where $G_1$ is not equal to $G_2$.

This embodiment may also be defined in terms of a Taylor series expansion, in which, the first nonlinear device is provided such that it has a Taylor series expansion describing the output signal voltage of the first nonlinear device, $y_1$, in terms of an input signal voltage of the first nonlinear device, $x_1$, as $y_1=a_0+a_1x_1+a_2x_1^2+a_3x_1^3+a_1x_1^4, \ldots$, the second nonlinear device is provided such that it has a Taylor series expansion describing the output signal voltage of the second nonlinear device, $y_2$, in terms of an input signal voltage of the second nonlinear device, $x_2$, as $y_2=b_0+b_1x_2+b_2x_2^2+b_3x_2^3+b_4x_2^4 \ldots$, such that nonlinearities of order n are substantially reduced or canceled by setting $a_n=b_n$, and $a_1$ does not equal $b_1$.

A second embodiment of the invention, an apparatus for substantially reducing and/or canceling nonlinear distortion, includes an input coupling means having an input and first and second outputs. The input coupling means is capable of splitting an input signal into first and second coupled signals that are in-phase with respect to each other. The apparatus also includes a first nonlinear device having an input in communication with the first output of the input coupling means and an output and a second nonlinear device having an input in communication with the second output of the input coupling means and an output. The nonlinear devices typically comprise amplifiers, mixers or the like, with substantially equal time delay and phase. The apparatus also includes a subtractor having a first input in communication with the output of the first nonlinear device, a second input in communication with the output of the second nonlinear device and an output. The subtractor is capable of subtracting an output signal of the second nonlinear device from the output of the first nonlinear device to generate a final output signal.

In this embodiment the second nonlinear device will typically have a different gain and a different third order intercept point than the first nonlinear device. As such, the gain of the first nonlinear device, the gain of the second nonlinear device, the predetermined nonlinearity of the first nonlinear device and the predetermined nonlinearity of the second nonlinear device are predetermined to cancel the predetermined nonlinearity of order n.

This embodiment may also be defined in terms of the following equation, in which, the gain of the first nonlinear device is defined as $G_1$, the gain of the second nonlinear device is defined as $G_2$, the third order output intercept point of the first nonlinear device is defined as $OIP3_1$, the third order output intercept point of the second nonlinear device is defined as $OIP3_2$, and $K=10\log_{10}(p_2/p_1)$, where $p_1$ is the input signal power level of the first nonlinear device and $p_2$ is the input signal power level of the second nonlinear device. In this application the first and second nonlinear devices and the input coupling means are provided such that $2(OIP3_1-OIP3_2)=3(G_1-G_2-K)$, where $G_1$ is not equal $G_2+K$.

This embodiment may also be defined in terms of the Taylor series expansion, in which the first nonlinear device is provided such that it has a Taylor series expansion describing the output signal voltage of the first nonlinear device, $y_1$, in terms of an input signal voltage of the first nonlinear device, $x_1$, as $y_1=a_0+a_1x_1+a_2x_1^2+a_3x_1^3+a^4x_1^4 \ldots$, the second nonlinear device is provided such that it has a Taylor series expansion describing the output signal voltage of the second nonlinear device, $y_2$ in terms of an input signal voltage of the second nonlinear device, $x_2$, as $y_2=b_0+b_1x_2+b_2x_2^2+b_3x_2^3+b_4x_2^4 \ldots$, the ratio, k, is provided such that $k=x_2/x_1$, where k is set by the input coupling means provided, such that nonlinearities of order n are substantially reduced and/or canceled by setting $k=(a_n/b_n)^{1/n}$.

A third embodiment of the invention, an apparatus for substantially reducing and/or canceling nonlinear distortion, includes a nonlinear device having an input and an output. The nonlinear device has a Taylor series expansion describing an output current, $i_0$, in terms of an input voltage, v, as $i_o=b_0+b_1v+b_2v^2+b_3v^3+b_4v^4$ ... The apparatus also includes a nonlinear load having an input in communication with the output of the nonlinear device. The nonlinear load has a Taylor series expansion describing a current through the nonlinear load, $i_L$, in terms of a terminal voltage, $v_L$, as $i_L=a_0+a_1v_L+a_2v_L^2+a_3v_L^3+a_4v_L^4$ .... The nonlinear device and the nonlinear load are provided such that $b_0=a_0$, $b_1=ca_1$, $b_2=c^2a_2$, $b_3=c^3a_3$, $b_n=c^na_n$ where, c, is a constant, so that the output of the nonlinear device substantially reduces and/or eliminates nonlinearities of the nonlinear device and the nonlinear load.

In the third embodiment the nonlinear device may include a first n-channel field effect transistor (FET) having a gate in communication with an input source, a source and well in communication with ground, and a drain in communication with an output. The nonlinear load may include a second n-channel FET having a source and well in communication with the drain of the first n-channel FET, and a gate and drain in common communication and a third n-channel FET having a source and well in communication with the drain of the second n-channel FET, and a gate and drain in common communication with a power supply.

In the third embodiment the nonlinear device may include a first npn bipolar junction transistor (BJT) having a base in communication with an input source, an emitter in communication with ground and a collector in communication with an output. The nonlinear load may include a second npn BJT having an emitter in communication with the collector of the first npn BJT, and a base and collector in common communication and a third npn BJT having an emitter in communication with a collector of the second npn BJT, and a base and collector in common communication with a power supply.

In a fourth embodiment of the invention, an apparatus for substantially reducing and/or canceling nonlinear distortion, includes a first nonlinear device having an input and an output and an input coupling means having an input in communication with the output of the first nonlinear device and first and second in-phase outputs. The apparatus also includes a second nonlinear device having an input in communication with the first in-phase output of the input coupling means and an output and a subtractor having a first input in communication with the output of the second nonlinear device, a second input in communication with the second in-phase output of the input coupling means and an output. The first and second nonlinear devices will typically comprise amplifiers, mixers or the like, with substantially equal time delay and phase. The subtractor subtracts the output signal of the second nonlinear device from the second in-phase output of the input coupler to generate a final output.

The fourth embodiment may also be defined in terms of the Taylor series expansion, in which, the first nonlinear device is provided to define a Taylor series expansion describing an output signal voltage, $y_1$, in terms of an input signal voltage, $x_1$, as $y_1=a_0+a_1x_1+a_2x_1^2+a_3x_1^3+a_4x_1^4$ ..., the second nonlinear is provided to define a Taylor series expansion describing an output signal voltage, $y_2$, in terms of an input signal voltage, $x_2$, as $y_2=b_0+b_1x_2+b_2x_2^2+b_3x_2^3+b_4x_2^4$ ..., and the ratio the first in-phase coupled signal voltage to the second in-phase coupled voltage being k. Third order nonlinearities are substantially reduced and/or canceled by setting, k in the apparatus such that $a_3-a_3b_1k-2a_1a_2b_2k^2-a_1^3b_3k^3=0$, and such that $a_1-a_1b_1k$ does not equal zero. Second order nonlinearities are substantially reduced and/or canceled by setting, k, in the apparatus such that $a_2-a_2b_1k-a_1^2b_2k^2=0$, and such that $a_1-a_1b_1k$ does not equal zero.

A fifth embodiment of the invention, an apparatus for substantially reducing and/or canceling nonlinear distortion, includes an input coupling means having an input and first and second outputs that is capable of splitting an input signal into first and second in-phase signals. The apparatus also includes a first nonlinear device having an input in communication with the second output of the input coupling means and an output. The apparatus additionally includes a subtraction means having a first input in communication with the first output of the input coupling means, a second input in communication with the output of the first nonlinear device and an output. The subtraction means phase-shifts 180-degrees an output signal of the first nonlinear device and combines such with the first in-phase signal to generate a difference signal. The apparatus of this embodiment also includes a second nonlinear device having an input in communication with the output of the subtraction means and an output. The first and second nonlinear devices will typically comprise amplifiers, mixers or the like, with substantially equal time delay and phase. The difference signal is processed at the second nonlinear device resulting in an output signal having substantially reduced and/or canceled nonlinear distortion.

This embodiment may also be defined in terms of a Taylor series expansion, in which the first nonlinear device is provided to define a Taylor series expansion describing an output signal voltage, $y_2$, in terms of an input signal voltage, $x_2$, as $y_2=b_0+b_1x_2+b_2x_2^2+b_3x_2^3+b_4x_2^4$ ..., the second nonlinear device is provided to define a Taylor series expansion describing an output signal voltage, $y_1$, in terms of an input signal voltage, $x_1$, as $y_1=a_0+a_1x_1+a_2x_1^2+a_3x_1^3+a_4x_1^4$ ..., and the ratio, k, of the input voltage of the first nonlinear device to the voltage of the first in-phase signal is a constant value provided by the input coupling means. Third order nonlinearities are substantially reduced and/or canceled by setting, k such that $2a_2b_1b_2k^3-2a_2b_2k^2-a_1b_3k^3+a_3-3a_3b_1k+3a_3b_1^2k_2-a_3b_1^3k^3=0$, and such that $a_1-a_1b_1k$ does not equal zero. Second order nonlinearities are substantially reduced and/or canceled by setting, k, such that $a_2b_1^2k^2-a_1b_2k^2-2a_2b_1k+a_2=0$, and such that $a_1-a_1b_1k$ does not equal zero.

A sixth embodiment of the invention, an apparatus for substantially reducing and/or canceling nonlinearities, includes a first and second differential subcircuit. The first differential subcircuit includes a first n-channel field-effect transistor (FET) having a gate in communication with a first bias voltage source, a source in communication with ground and a drain and a first differential pair that includes second and third n-channel FETs. The second n-channel FET having a gate in communication with a positive terminal of a differential input source, a source in communication with the drain of the first n-channel FET and a drain in communication with a negative terminal of a differential output. The third n-channel FET having a gate in communication with a negative terminal of the differential input source, a source in communication with the drain of the first n-channel FET and a drain in communication with a positive terminal of the differential output. The second differential subcircuit includes a fourth n-channel FET having a gate in communication with a second bias voltage source, a source in communication with ground and a drain and a second differential pair that includes fifth and sixth n-channel FETs. The fifth n-channel FET having a gate in communication with the positive terminal of the differential input source, a source in communication with the drain of the fourth n-channel FET and a drain in communication with the positive terminal of the differential output. The sixth n-channel FET having a gate in communication with the negative terminal of the differential input source, a source in communication with the drain of the fourth n-channel FET and a drain in communication with the negative terminal of the differential output. The apparatus also includes a first load resistor electrically connected between a power supply and the drains of the second and sixth n-channel FETs and a second load resistor electrically connected between the power supply and the drains of the third and fifth n-channel FETs. A differential input signal is connected in-phase to the first and second differential subcircuits such that an output of the first differential subcircuit is subtracted from the output of the second differential subcircuit to substantially reduce and/or cancel third order nonlinearities.

In this embodiment the gain of the first differential subcircuit, the gain of the second differential subcircuit, a predetermined order output intercept point of the first differential subcircuit and a predetermined order intercept point of the second differential subcircuit may be predetermined such that a predetermined order nonlinearity is substantially reduced and/or canceled.

This embodiment may also be defined in terms of the following equation, in which a gain of the first differential subcircuit is defined as $G_1$, the gain of the second differential subcircuit is defined as $G_2$, the third order output intercept point of the first differential subcircuit is defined as $OIP3_1$, and the third order output intercept point of the second differential subcircuit is defined as $OIP3_2$, such that the first and second differential subcircuits are provided such that $2(OIP3_1-OIP3_2)=3(G_1-G_2)$ to substantially reduce and/or cancel third order nonlinear distortion, where $G_1$ is not equal to $G_2$.

A seventh embodiment of the present invention, an apparatus for substantially reducing and/or canceling nonlinear distortion, includes an input coupling means having an input and first and second outputs. The input coupling means splits an input signal into a first and second in-phase coupled signals. The device also includes a first nonlinear having an input in communication with the first output of the input coupling means and an output and a second nonlinear device having an input in communication with the second output of the input coupling means and an output. The first and second nonlinear devices will typically comprise amplifiers, mixers or the like, with substantially equal time delay and phase. The apparatus also includes a second coupling means having a first input in communication with the output of the first nonlinear device, a second input in communication with the output of the second nonlinear device and an output, wherein the second coupling means 180-degree phase shifts and multiplies by a constant factor, $k_2$, an output signal of the second nonlinear device and combines such with the output of the first nonlinear device.

In this embodiment of the invention the gain of the first nonlinear device, the gain of the second nonlinear device, the predetermined nonlinearity of the first nonlinear device and the predetermined nonlinearity of the second nonlinear device may be predetermined to substantially reduce and/or cancel the predetermined nonlinearity of order n.

This embodiment of the invention may also be defined in terms of an equation, in which, a gain of the first nonlinear device is defined as $G_1$ dB, a gain of the second nonlinear device is defined as G2 dB, a third order output intercept point of the first nonlinear device is defined as $OIP3_1$ dBm and a third order output intercept point of the second nonlinear device is $OIP3_2$ dBm, such that $K1=10 \log_{10}(p_2/p_1)$, where $p_1$ is the input signal power level of the first nonlinear device and $p_2$ is the input signal power level of the second nonlinear device, $K2=20 \log_{10}(k_2)$, where $k_2$ is the aforementioned multiplicative factor established by the second coupling means. The input coupling means, the second coupling means, and the first and second nonlinear devices are provided such that $2(OIP3_1-OIP3_2-K2)=3(G_1-G_2-K1-K2)$, and where $G_1$ is not equal to $G_2+K1+K2$.

This embodiment of the invention may also be defined in terms of a Taylor series equation, in which the first nonlinear device is provided such that it has a Taylor series expansion describing the output signal voltage of the first nonlinear device, $y_1$, in terms of an input signal voltage of the first nonlinear device, $x_1$, as $y_1=a_0+a_1x_1+a_2x_1^2+a_3 x_1^3+a_4x_1^4 \ldots$, the second nonlinear device is provided such that it has a Taylor series expansion describing the output signal voltage of the second nonlinear device, $y_2$, in terms of an input signal voltage of the second nonlinear device, $x_2$, as $y_2=b_0+b_1x_2+b_2x_2^2+b_3x_2^3+b_4x_2^4 \ldots$, where the ratio $k_1=x_2/x_1$. The ratio $k_2$ is the aforementioned multiplicative factor established by the second coupling means. Nonlinearities of order n are substantially reduced and/or canceled by setting $a_n-k_2b_nk_1^n=0$, and such that $a_1-k_2b_1k_1$ does not equal zero.

This embodiment of the invention may also include an adaptive control and feedback means having an input in communication with the output of the second coupling means, a first output in communication with the first coupling means, a second output in communication with first nonlinear device, a third output in communication with the second nonlinear device and a fourth output in communication with the second nonlinear device. The adaptive control and feedback means controls the nonlinearity, gain and phase of the first and second coupling means and the first and second nonlinear devices.

An eighth embodiment of the invention, an apparatus for substantially reducing and/or canceling nonlinear distortion, includes a first nonlinear device having an input and an output and a second nonlinear device having an input and an output, the inputs of the first and second nonlinear devices are in communication with an input signal. The apparatus also includes an attenuator having an input in communication with output of the first nonlinear device and an output and a first subtractor having a first input in communication with the output of the second nonlinear device, a second input in communication with the output of the attenuator and an output. The first subtractor subtracts an output of the second nonlinear device from an output of the attenuator. Additionally, the apparatus includes a third nonlinear device having an input in communication with the output of the first nonlinear device and an output and a fourth nonlinear device having an input in communication with output of the first subtractor and an output. Also, the apparatus includes a second subtractor having a first input in communication with the output of the third nonlinear device, a second input in communication with the output of the fourth nonlinear device and an output. The second subtractor subtracts the output of the fourth nonlinear device from the output of the third nonlinear device to form a final output signal.

In this embodiment the first nonlinear device and the second nonlinear device may be of equal time delay and phase, the third and fourth nonlinear devices may be equal in time delay and phase, and predetermined order nonlinearities are substantially reduced and/or canceled in the final output signal by predetermined selection of attenuation in the attenuator and predetermined selection of the gain, nonlinearity, and intercept points of the first, second, third and fourth nonlinear devices. In addition, predetermined order nonlinearities are substantially reduced and/or canceled in the final output signal by predetermined selection of the attenuation in the attenuator and predetermined selection of a Taylor series expansion of the first, second, third and fourth nonlinear devices.

This embodiment of the invention may also be defined in terms of a Taylor series expansion, in which, the first nonlinear device is provided such that it has a Taylor series expansion describing the output signal of the first nonlinear device, $y_1$, in terms of an input signal of the first nonlinear device, $x_1$, as $y_1 = a_0 + a_1 x_1 + a_2 x_1^2 + a_3 x_1^3 + a_4 x_1^4 \ldots$ . The second nonlinear device is provided such that it has a Taylor series expansion describing the output signal of the second nonlinear device, $y_2$ in terms of an input signal of the second nonlinear device, $x_2$, as $y_2 = b_0 + b_1 x_2 + b_2 x_2^2 + b_3 x_2^3 + b_4 x_2^4 \ldots$ The third nonlinear device is provided such that it has a Taylor series expansion describing the output signal of the third nonlinear device, $y_3$ in terms of an input signal of the third nonlinear device, $x_3$, as $y_3 = c_0 + c_1 x_3 + c_2 x_3^2 + c_3 x^3 + c_4 x_3^4 \ldots$ . The fourth nonlinear device is provided such that it has a Taylor series expansion describing the output signal of the fourth nonlinear device, $y_4$ in terms of an input signal of the fourth nonlinear device, $x_4$, as $y_4 = d_0 + d_1 x_4 + d_2 x_4^2 + d_3 + d_4 x_4^3 + d_4 x_4^4 \ldots$ The ratio, k, is provided such that k equals the ratio of the output signal of the attenuator to the input signal of the attenuator. Third order nonlinear distortion is substantially reduced and/or canceled by setting $b_1^3 d_3 + b_3 d_1 + 2 a_1 b_2 d_2 k - 2 b_1 b_2 d_2 - 2 a_1 a_2 d_2 k^2 + 3 a_1^2 b_1 d_3 k^2 - 3 a_1 b_1^2 d_3 k - a_1^3 d_3 k^3 + 2 a_1 a_2 c_2 + a_1^3 c_3 + a_3 c_1 + 2 a_2 b_1 d_2 k - a_3 d_1 k = 0$, and such that $b_1 d_1 + a_1 c_1 - a_1 d_1 k \neq 0$.

Alternatively, this embodiment of the invention is defined where second order nonlinear distortion is substantially reduced and/or canceled by setting $b_2 d_1 + a_1^2 c_2 - b_1^2 d_2 + 2 a_1 b_1 d_2 k + a_2 c_1 - a_1^2 d_2 k^2 - a_2 d_1 k = 0$, and such that $b_1 d_1 + a_1 c_1 - a_1 d_1 k \neq 0$.

In a ninth embodiment of the present invention, an apparatus for substantially reducing and/or canceling nonlinear distortion includes an input coupling means having an input and first and second outputs. The input coupling means is capable of splitting an input signal into first and second in-phase signals. The apparatus also includes a first nonlinear device having an input in communication with the first output of the in-phase coupling means and an output and a second nonlinear device having an input in communication with the second output of the in-phase coupling means and an output. Additionally, the apparatus also includes an attenuator having an input in communication with output of the first nonlinear device and an output and a second coupling means having a first input in communication with the output of the second nonlinear device, a second input in communication with the output of the attenuator and an output. The second coupling means combines a 180-degree phase-shifted and attenuated output of the second nonlinear device with an output of the attenuator. The apparatus also includes a third nonlinear device having an input in communication with output of the first nonlinear device and an output and a fourth nonlinear device having an input in communication with the output of the second coupling means and an output. The apparatus also includes a third coupling means having a first input in communication with the output of the third nonlinear device, a second input in communication with the output of the fourth nonlinear device and an output. The third coupling means combines a 180 degree phase shifted and attenuated output of the fourth nonlinear device with the output of the third nonlinear device to form a final output signal.

In this embodiment, predetermined order nonlinearities of order n are substantially reduced and/or canceled in the final output signal by predetermined selection of the attenuation in the attenuator, coupling coefficients of the first, second, and third couplers, and Taylor series expansion of the first, second, third and fourth nonlinear devices.

Thus, the present invention involves apparatus and methods for substantially reducing and/or canceling nonlinearities in circuits, devices, and systems. In particular the present invention substantially reduces and/or cancels and eliminates odd order nonlinearities, such as the $a_3 x^3$ and $a_5 x^5$ terms in the Taylor series expansion of nonlinear circuits, devices, and systems. The apparatus and methods of the present invention substantially reduce and/or cancel nonlinearities without the need to incorporate delay lines, undistorted reference signals and distortion error signals. Additionally, the present invention substantially reduces and/or cancels nonlinearities with minimal adverse effect on noise figure and with minimal added noise. Specifically, the present invention provides means for substantially reducing and/or canceling third order nonlinearities in circuits, devices, and systems, in particular amplifier or mixer circuits.

BRIEF DESCRIPTION OF THE DRAWINGS

Figure 1:
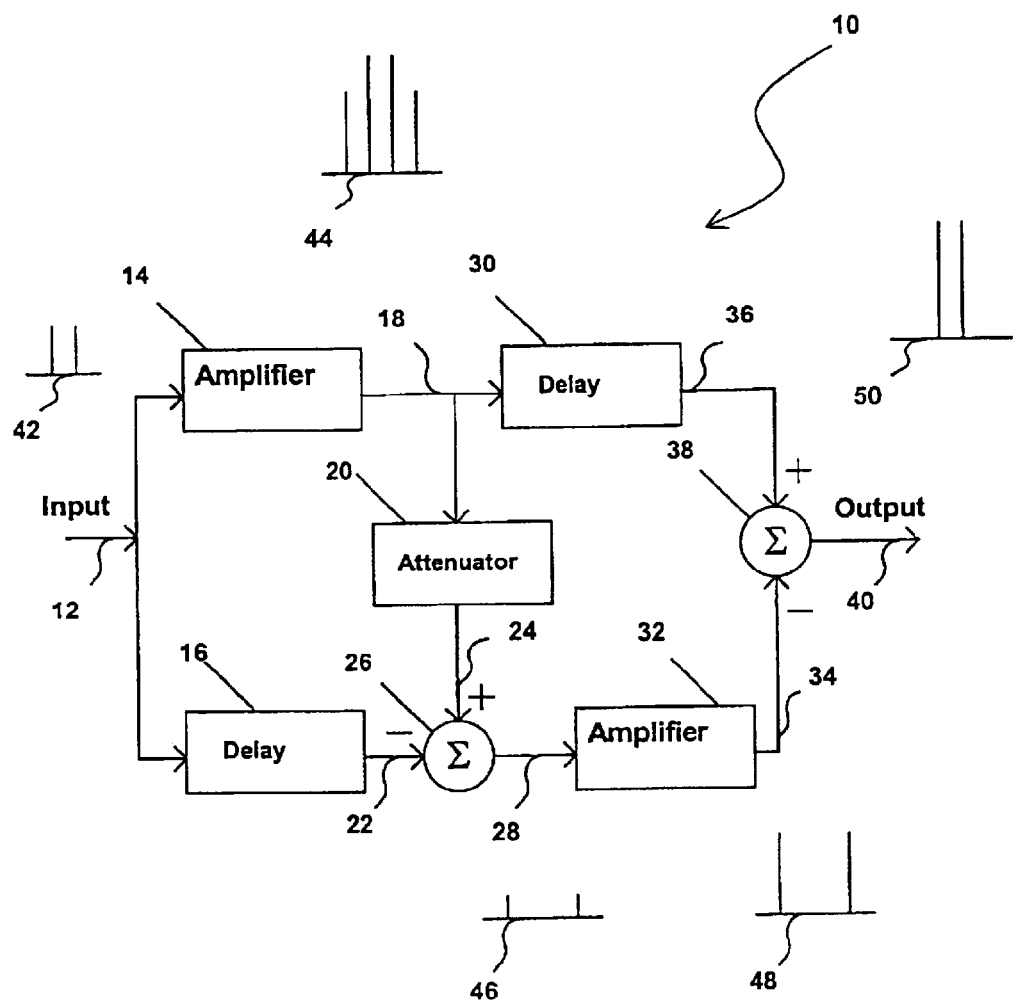

Having thus described the invention in general terms, reference will now be made to the accompanying drawings, which are not necessarily drawn to scale, and wherein:

FIG. 1 illustrates a schematic drawing of feedforward cancellation/elimination of nonlinearity techniques, in accordance with the prior art.

Figure 2:
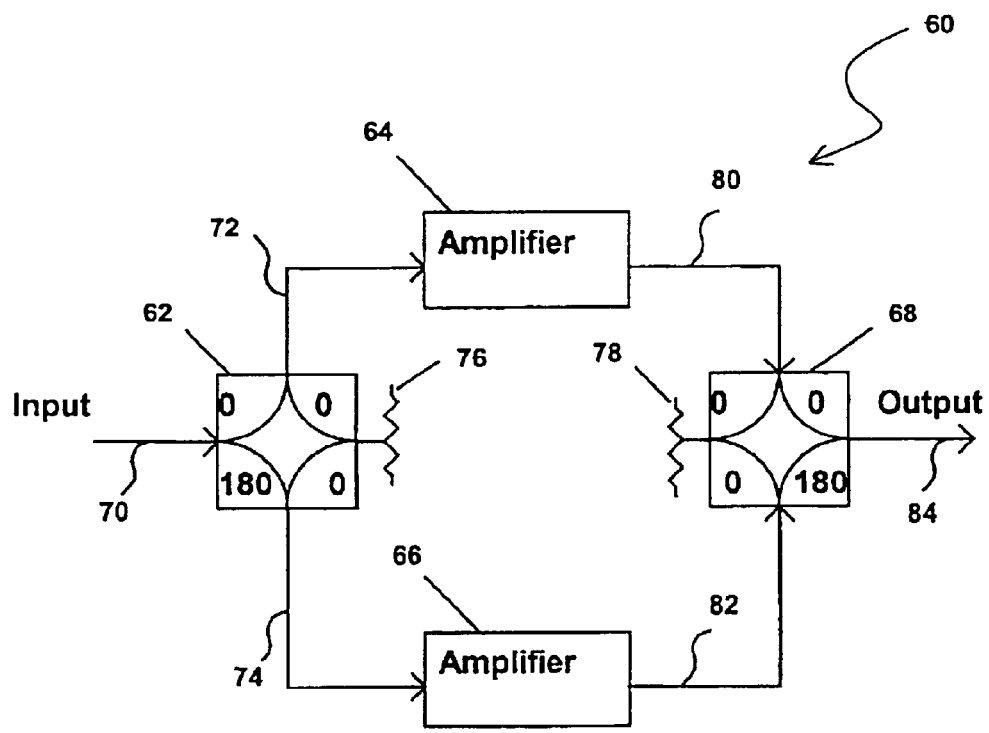

FIG. 2 illustrates a schematic drawing of an apparatus for cancellation/elimination of even-order nonlinear distortion, in accordance with the prior art.

Figure 3:
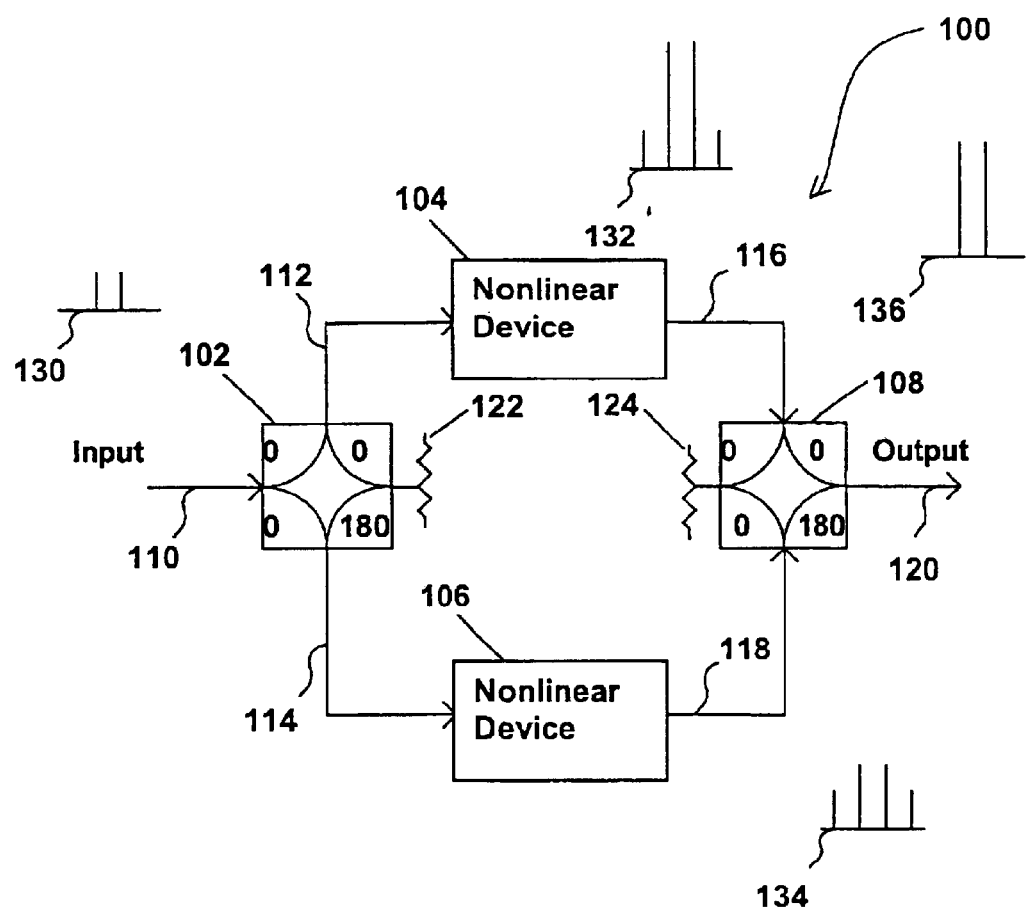

FIG. 3 illustrates a schematic drawing of an apparatus for substantially reducing and/or canceling nonlinear distortion, in accordance with an embodiment of the present invention.

Figure 4:
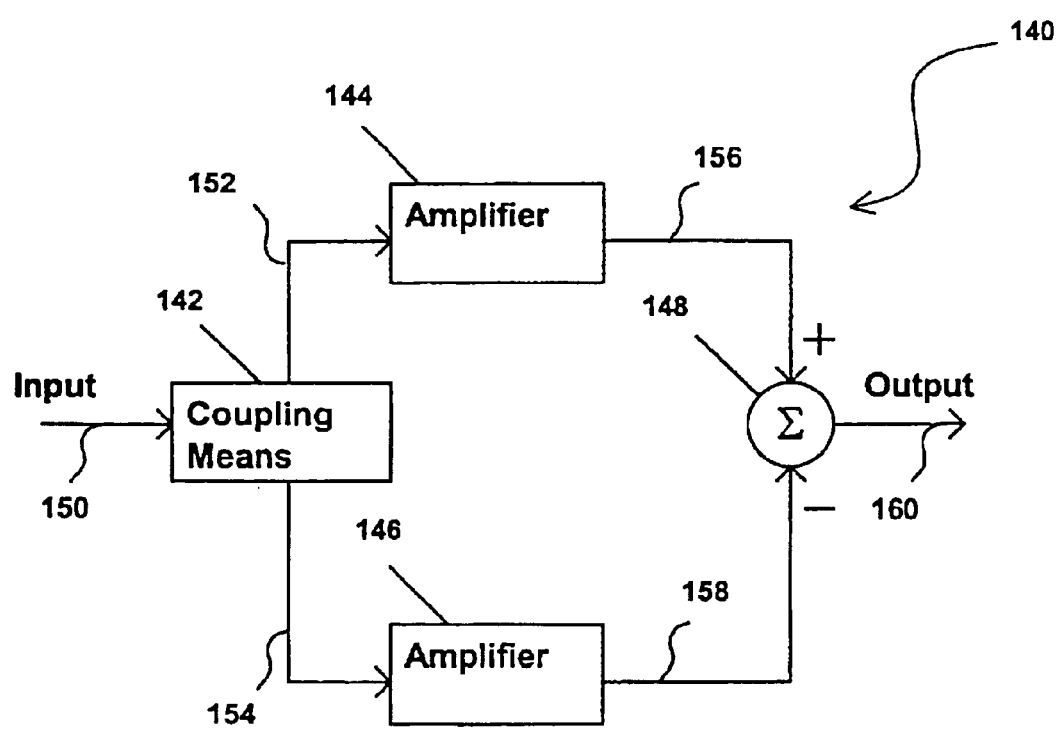

FIG. 4 illustrates a schematic drawing of an apparatus for substantially reducing and/or canceling nonlinear distortion, in accordance with an embodiment of the present invention.

FIG. 5 depicts a flow diagram of a method for substantially reducing and/or canceling third order nonlinear distortion, in accordance with an embodiment of the present invention.

Figure 6:
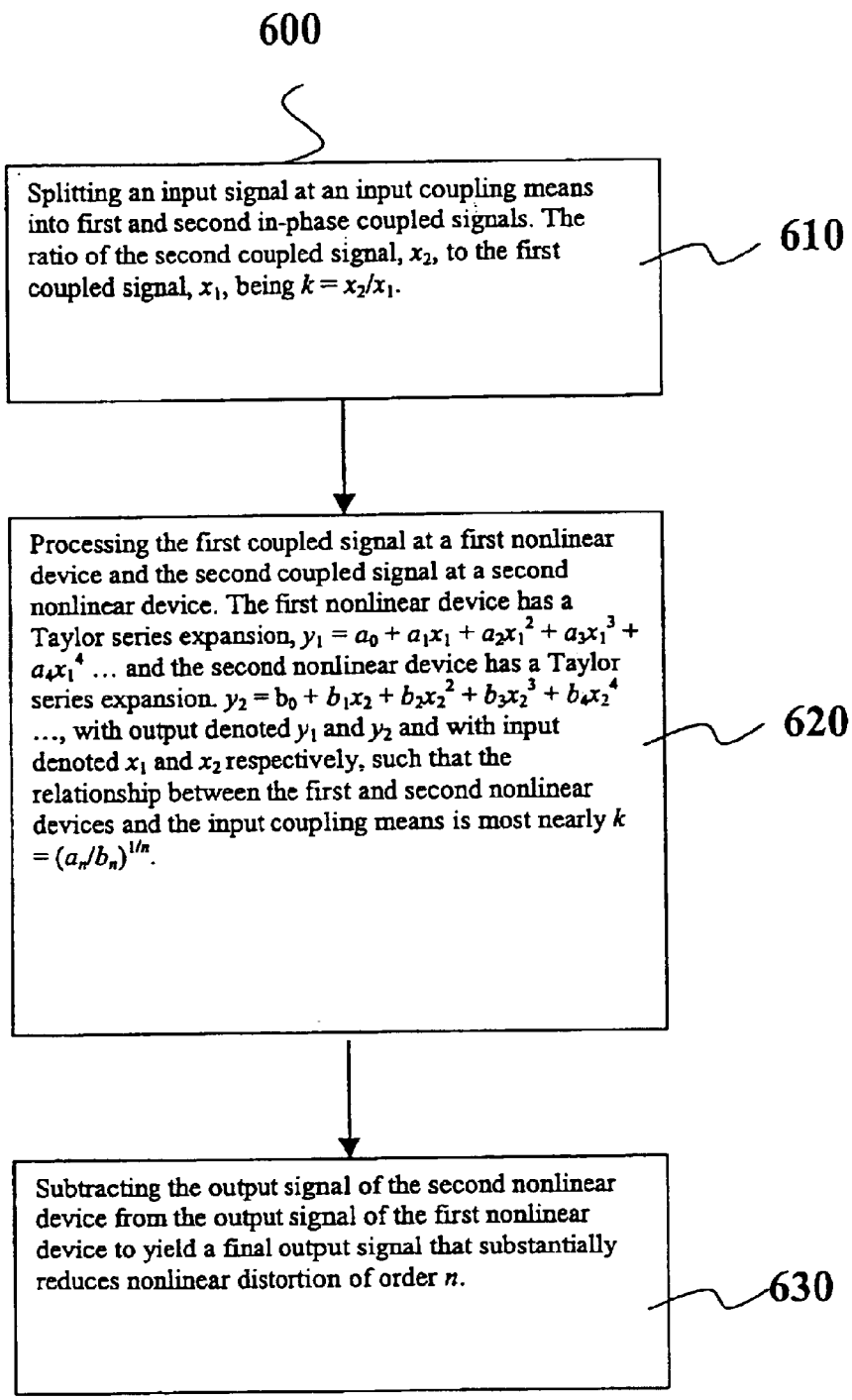

FIG. 6 illustrates flow diagram of a method for substantially reducing and/or canceling nonlinear distortion, in accordance with an embodiment of the present invention.

Figure 7:
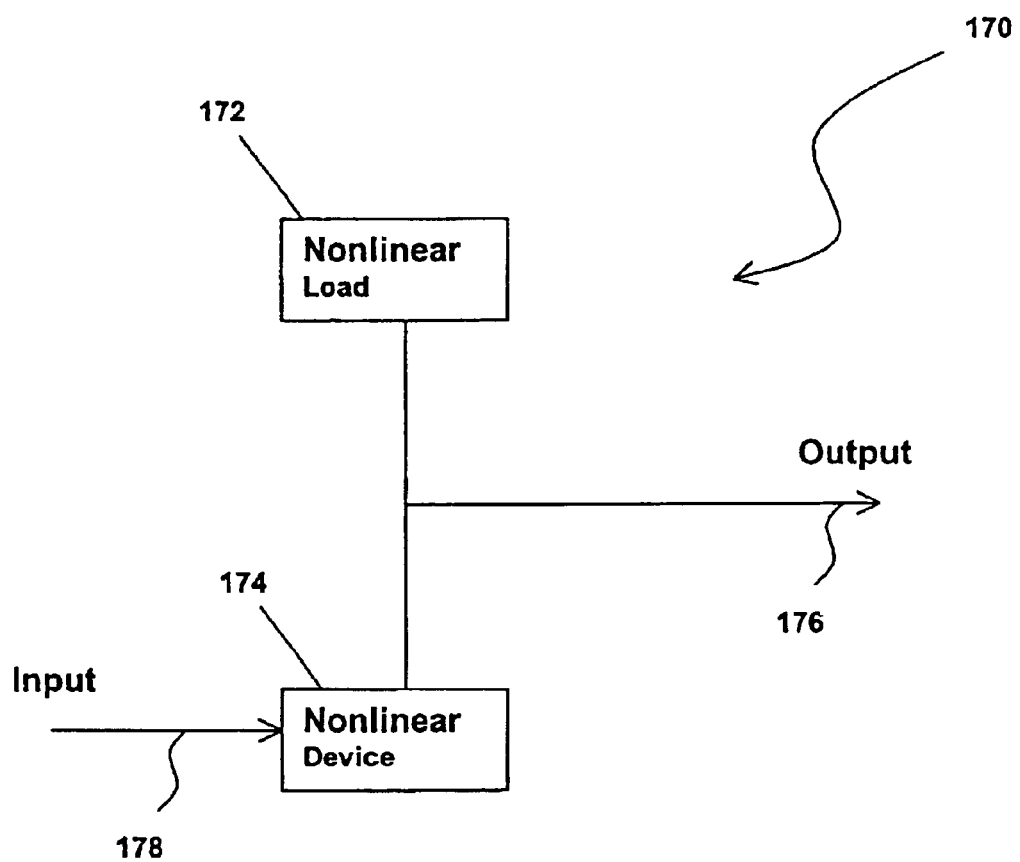

FIG. 7 illustrates a schematic diagram of an apparatus for substantially reducing and/or canceling nonlinear distortion, in accordance with an embodiment of the present invention.

Figure 8:
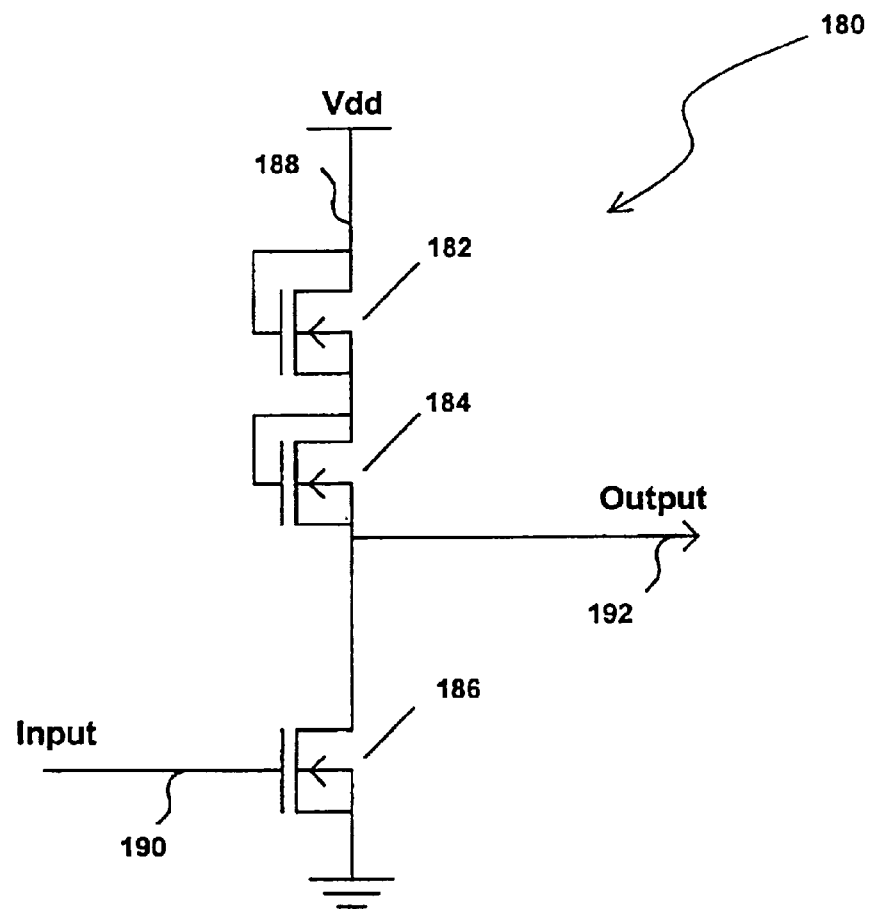

FIG. 8 illustrates a schematic diagram of a specific apparatus for substantially reducing and/or canceling nonlinear distortion, in accordance with an embodiment of the present invention.

Figure 9:
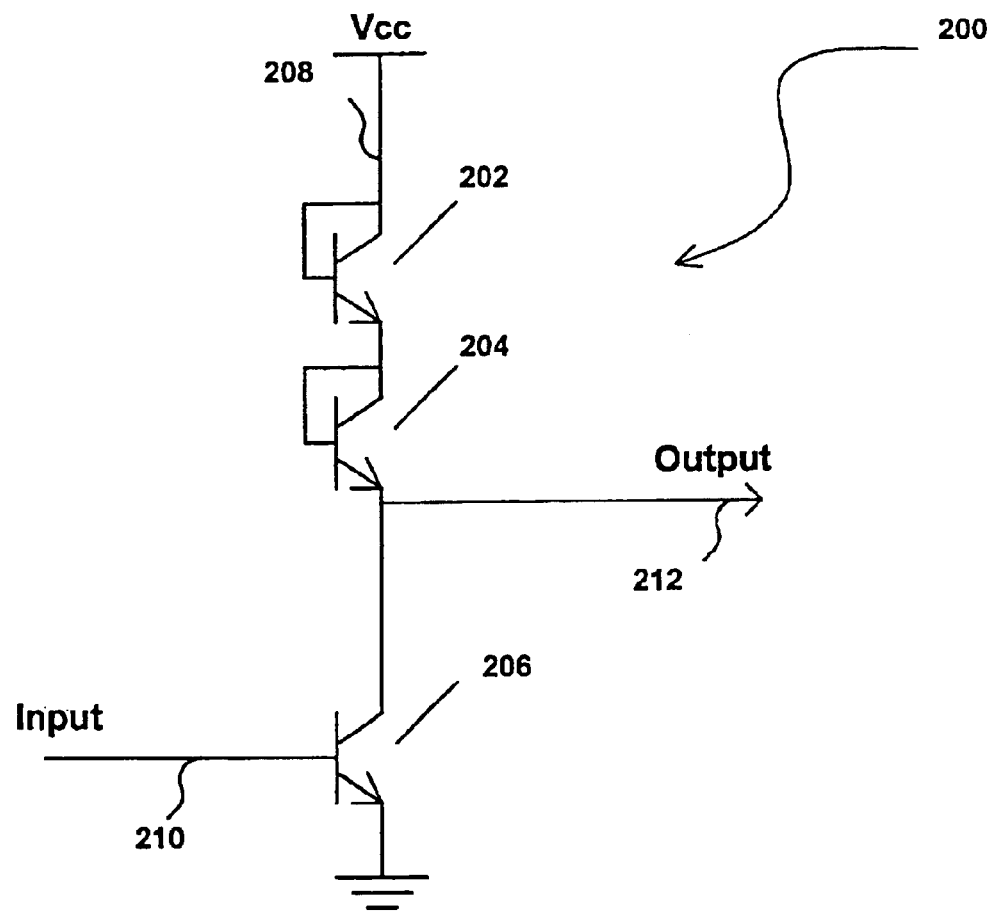

FIG. 9 illustrates a schematic diagram of a specific apparatus for substantially reducing and/or canceling nonlinear distortion, in accordance with an embodiment of the present invention.

Figure 10:
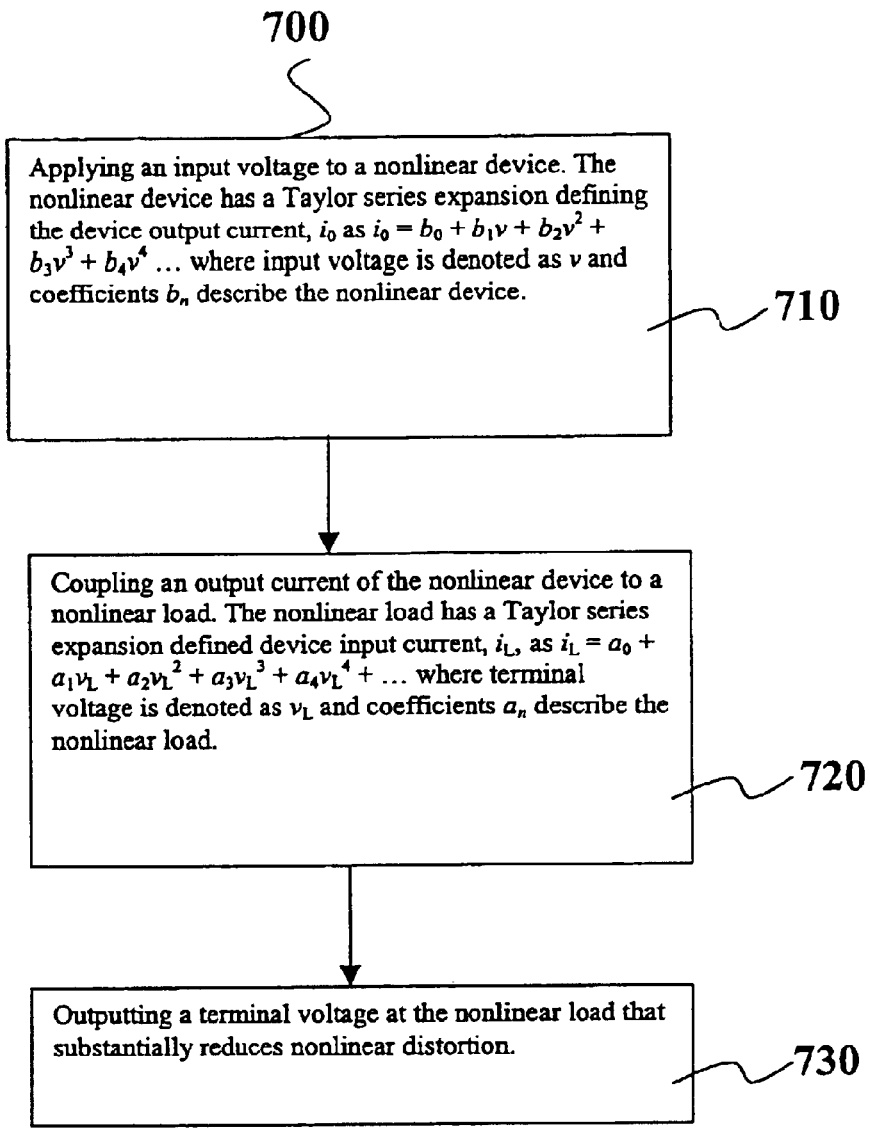

FIG. 10 illustrates a flow diagram of a method for substantially reducing and/or canceling nonlinear distortion, in accordance with an embodiment of the present invention.

Figure 11:
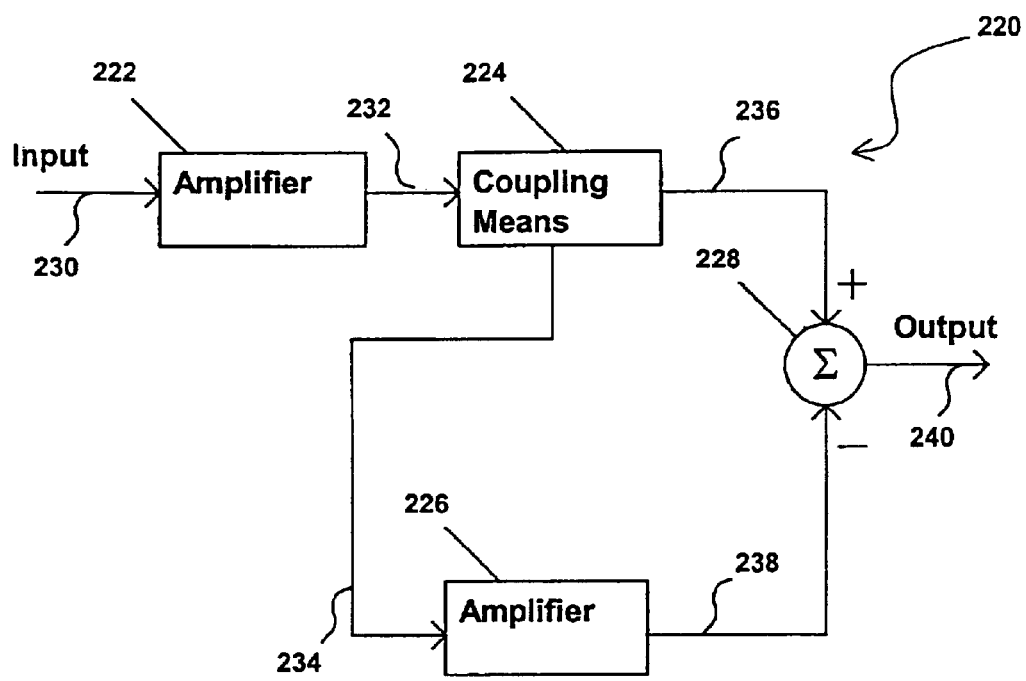

FIG. 11 illustrates a schematic diagram of an apparatus for substantially reducing and/or canceling nonlinear distortion, in accordance with an embodiment of the present invention.

Figure 12:
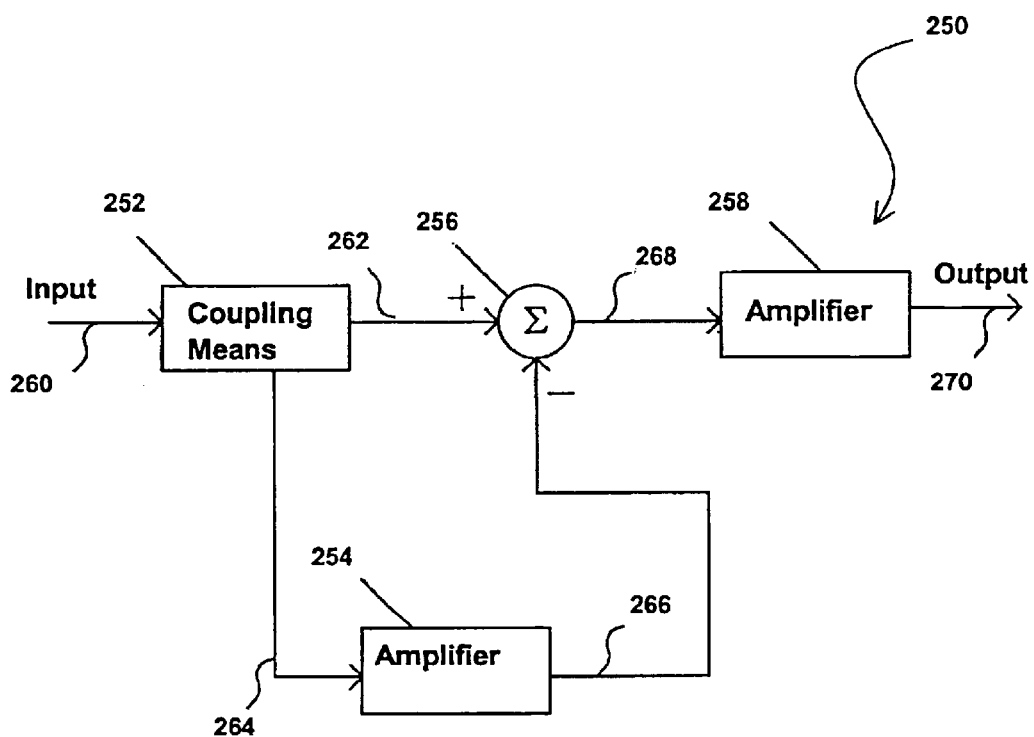

FIG. 12 illustrates a schematic diagram of an apparatus for substantially reducing and/or canceling nonlinear distortion, in accordance with an embodiment of the present invention.

Figure 13:
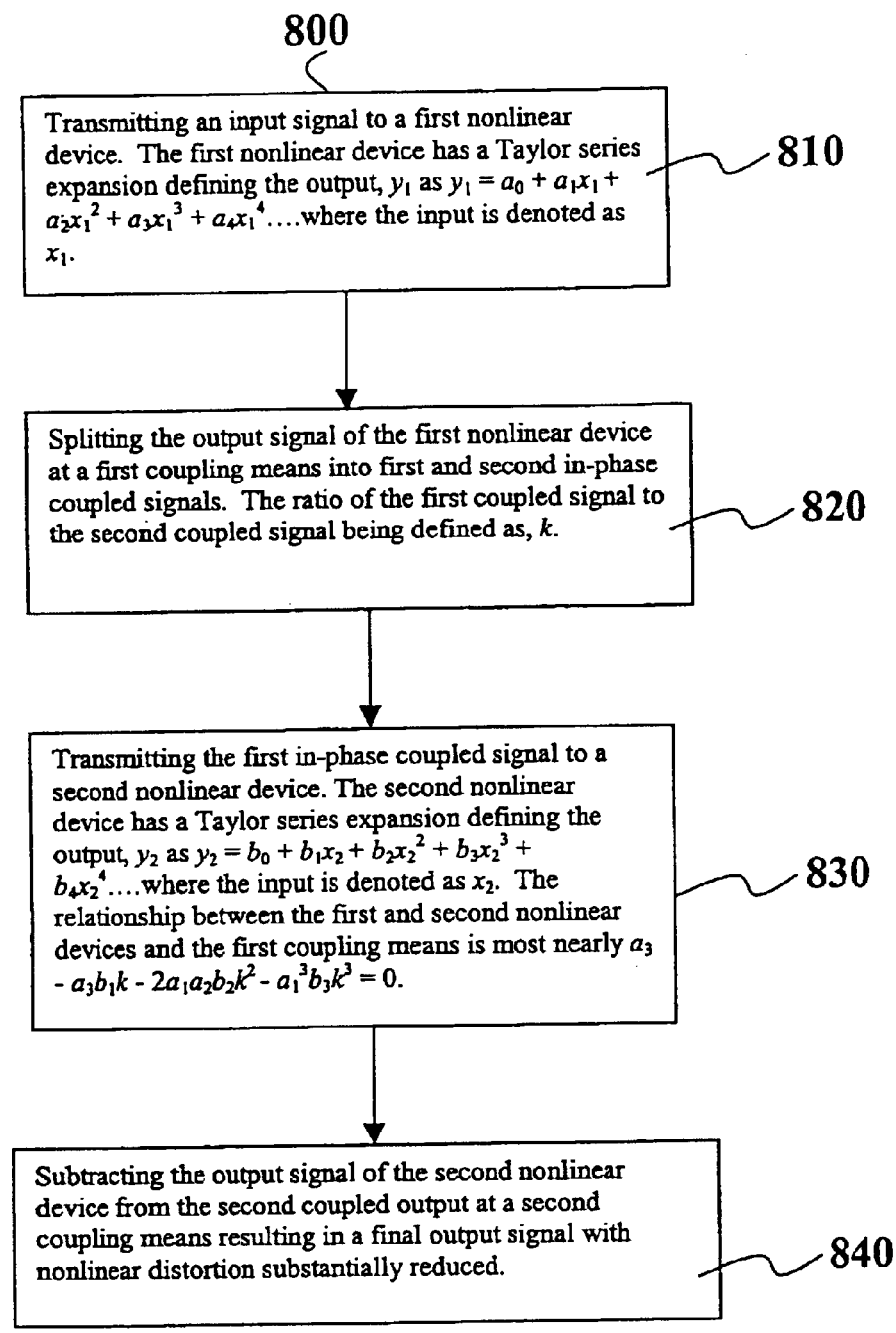

FIG. 13 illustrates a flow diagram of a method for substantially reducing and/or canceling nonlinear distortion, in accordance with an embodiment of the present invention.

Figure 14:
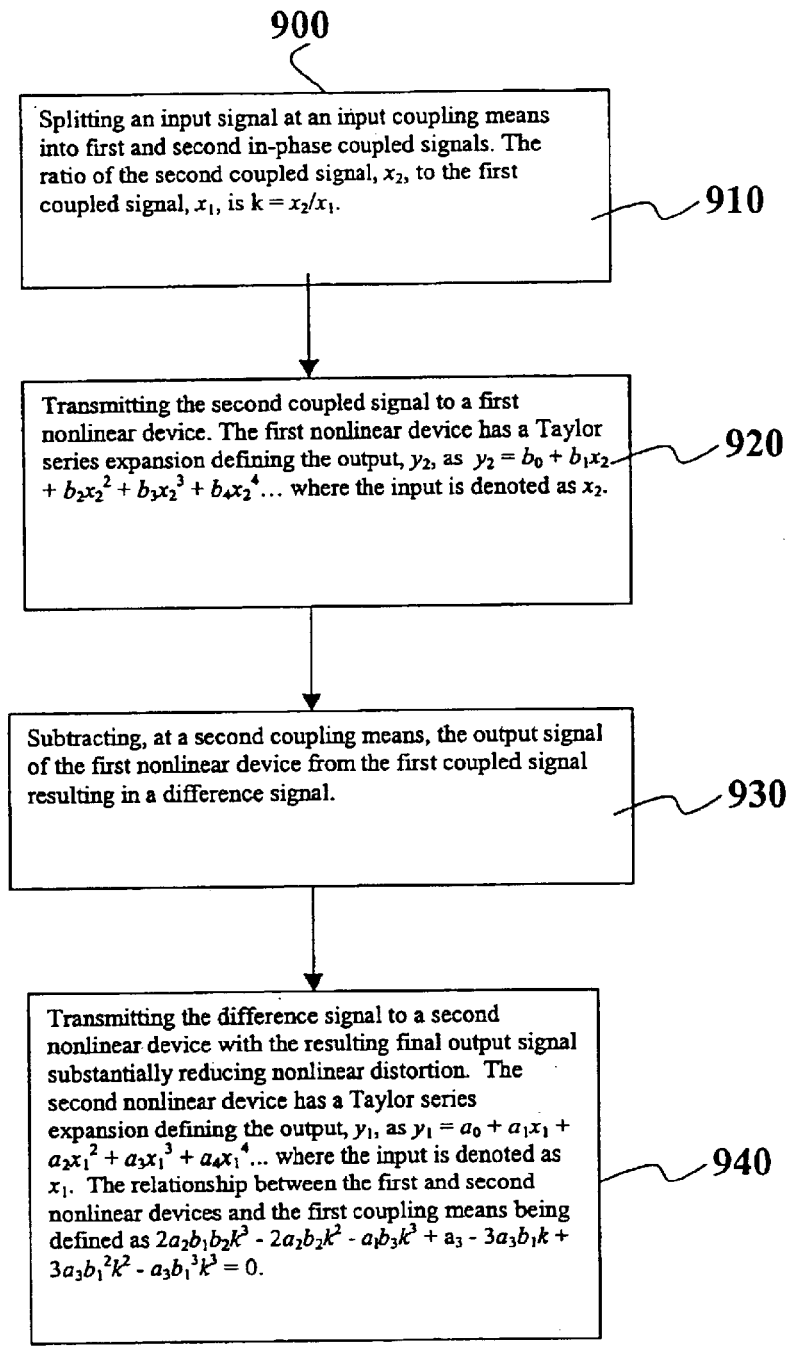

FIG. 14 illustrates a flow diagram of a method for substantially reducing and/or canceling nonlinear distortion, in accordance with an embodiment of the present invention.

Figure 15:
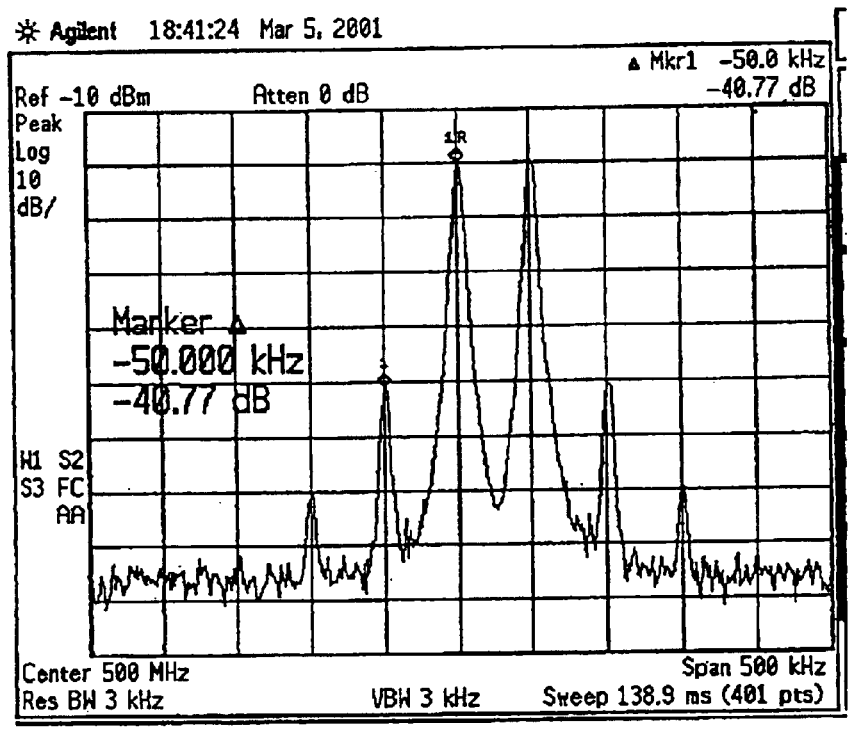

FIG. 15 illustrates test data, in accordance with an embodiment of the present invention.

Figure 16:
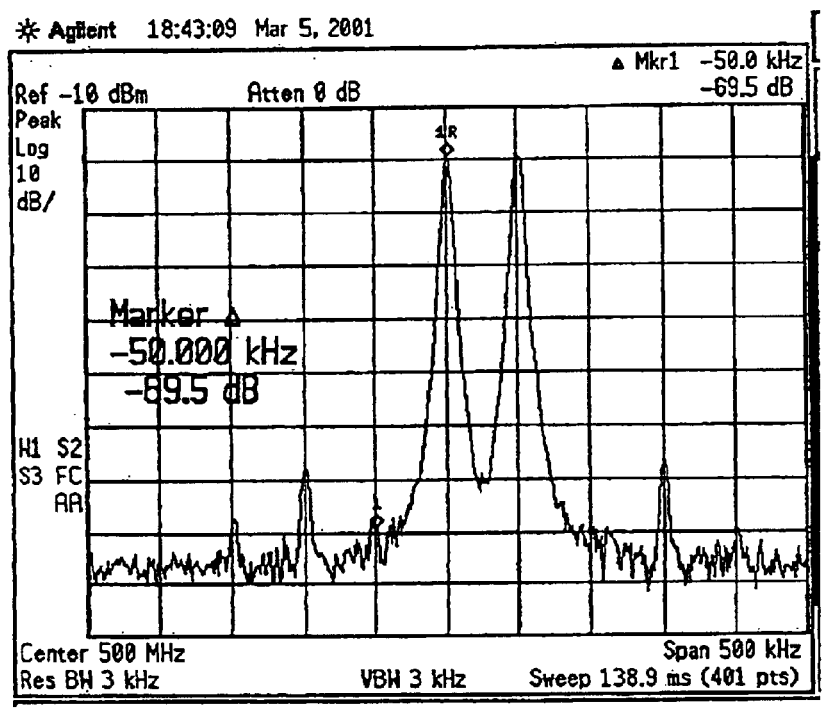

FIG. 16 illustrates test data, in accordance with an embodiment of the present invention.

Figure 17:
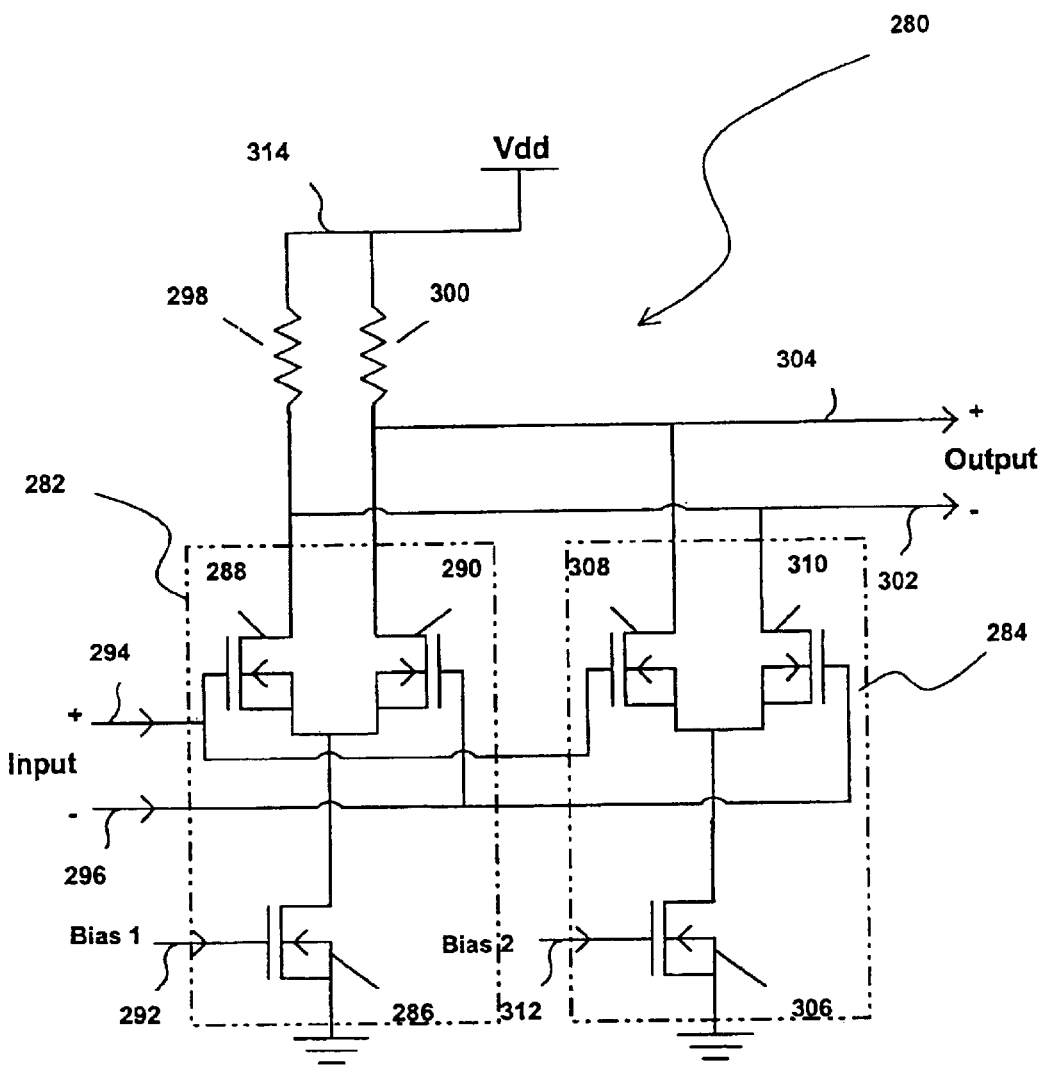

FIG. 17 illustrates a schematic diagram of an apparatus for substantially reducing and/or canceling nonlinear distortions, in accordance with an embodiment of the present invention.

Figure 18:
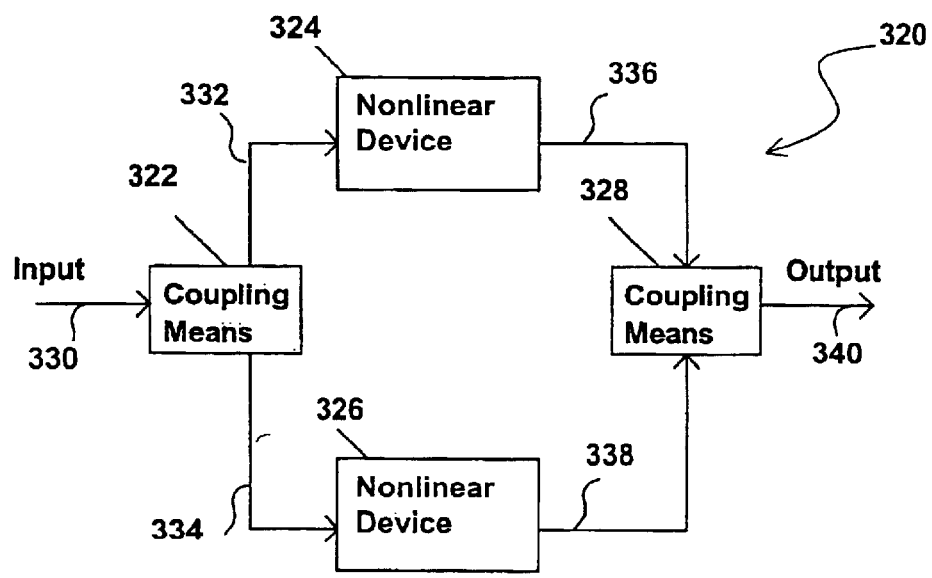

FIG. 18 illustrates a schematic diagram of an apparatus for substantially reducing and/or canceling nonlinear distortions, in accordance with an embodiment of the present invention.

Figure 19:
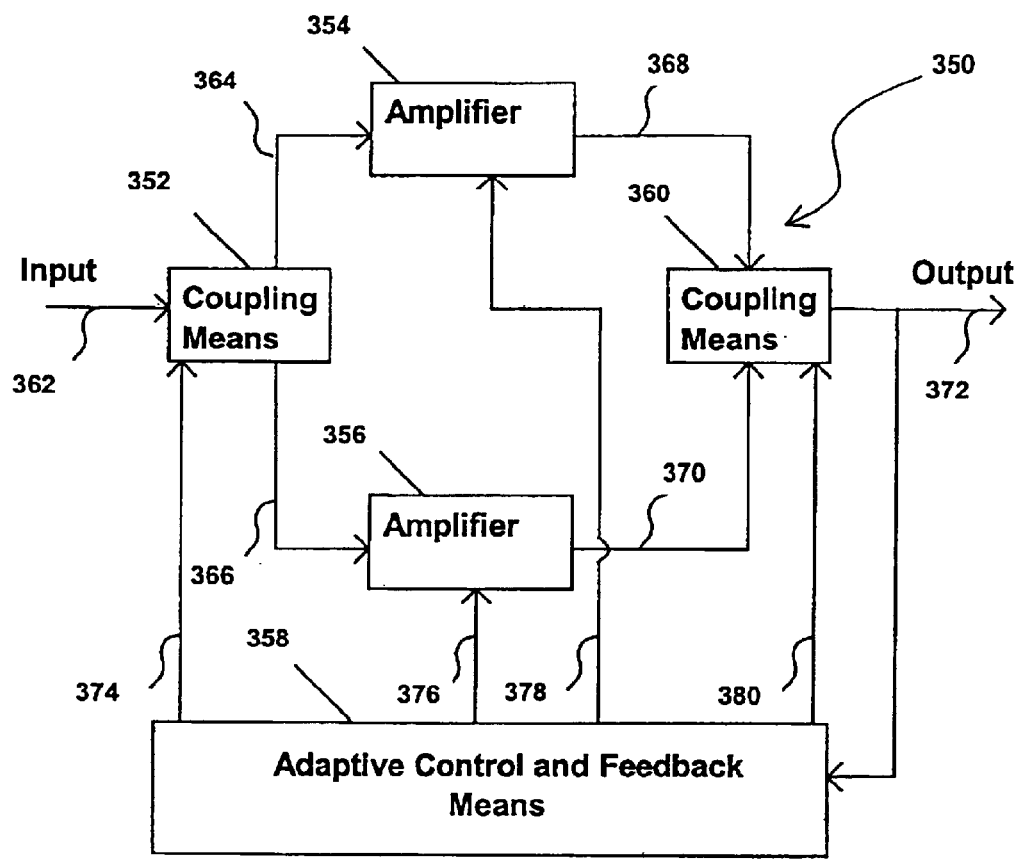

FIG. 19 illustrates a schematic diagram of an apparatus for substantially reducing and/or canceling nonlinear distortions, in accordance with an embodiment of the present invention.

Figure 20:
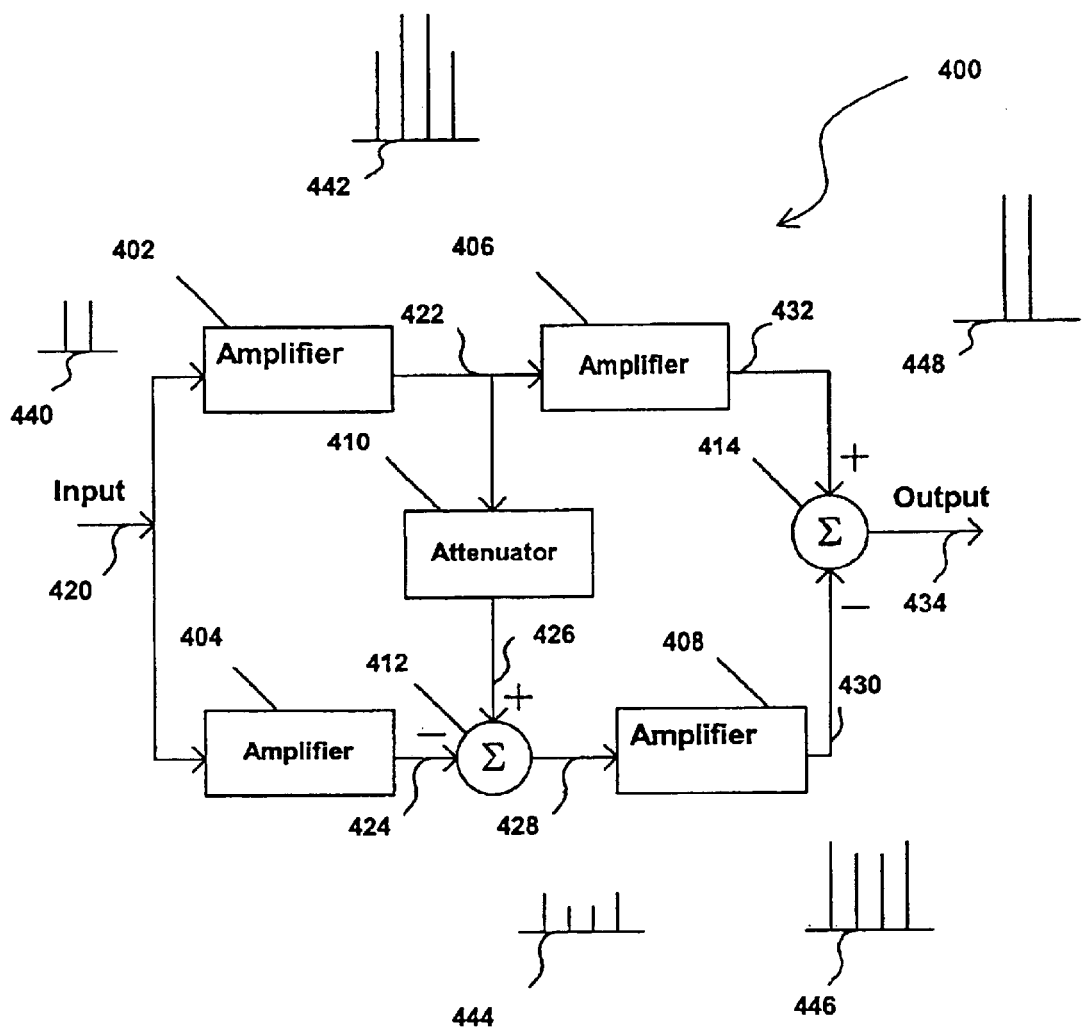

FIG. 20 illustrates a schematic diagram of an apparatus for substantially reducing and/or canceling nonlinear distortions, in accordance with an embodiment of the present invention.

Figure 21:
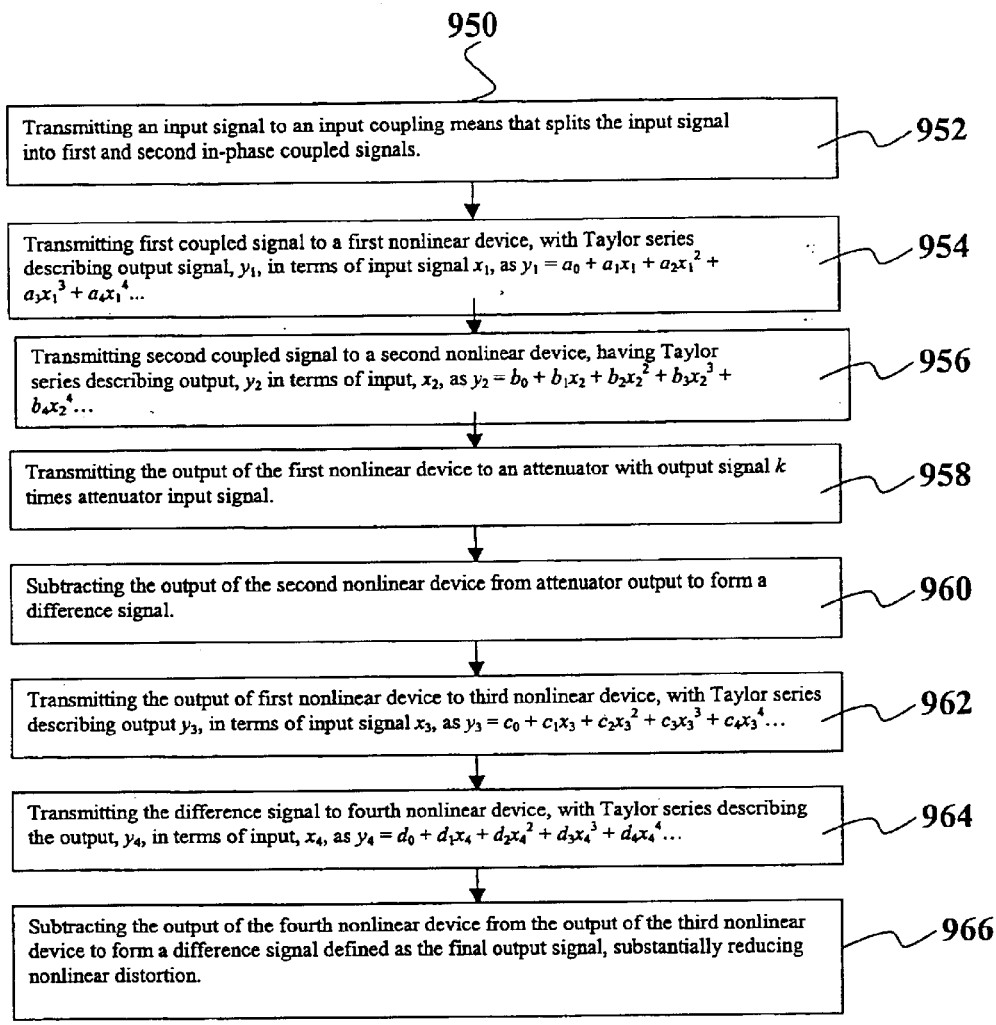

FIG. 21 illustrates a flow diagram of a method for substantially reducing and/or canceling nonlinear distortion, in accordance with an embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In accordance with an embodiment of the present invention, FIG. 3 illustrates a schematic drawing of an apparatus for substantially reducing and/or eliminating nonlinear distortion in devices. The circuit 100 includes an in-phase splitter 102, a first nonlinear device, such as first amplifier 104, a second nonlinear device, such as second amplifier 106 and a 180-degree out-of-phase combiner 108. The in-phase splitter and the 180-degree out-of-phase combiner are shown for purpose of illustration as 180-degree hybrids, but can be implemented with other devices, as is known by those of ordinary skill in the art. In operation, the in-phase splitter 102 splits the input signal 110 into first and second equal-amplitude in-phase signals 112 and 114. The first in-phase signal is applied as input to a first amplifier 104 and the second in-phase signal is applied as input to a second amplifier 106. The first amplified output signal 116 is combined with the second amplified output signal 118 in the 180-degree out-of-phase combiner 108, such that the first amplified output signal 116 is combined with a 180 degree phase shifted version of the second amplified output signal 118 to generate the final output signal 120. The effect of the 180-degree out-of-phase combiner is to subtract the second amplified output signal from the first amplified output signal to form the final output signal. Additionally, the fourth port of the in-phase splitter and the 180-degree out-of-phase combiner, shown for purpose of illustration as 180-degree hybrids, are terminated in matched impedance loads 122 and 124.

The first and second amplifiers 104 and 106 are designed such that they have unequal gains, otherwise the final output signal 120 would not include an amplified version of the input signal 110, since amplified components of the input signal would be canceled and eliminated upon recombination out-of-phase in the 180-degree out-of-phase combiner 108. In addition to being designed for unequal gains, the first and second amplifiers are designed with substantially equal time delay and phase and such that one of their nonlinear distortion components, such as third order nonlinear distortion, of the first and second amplified output signals 116 and 118 has equal amplitudes at the outputs of the first and second amplifiers. In the particular case of substantially reducing and/or canceling third order distortion, the first and second amplifiers are designed such that the third order distortion components are equal at the first and second amplified output signals. Additionally, amplifiers can be designed for varying levels of distortion, including third order nonlinear distortion, by adjusting current and voltage bias levels of components within the amplifier and by selection or design of the components used within the amplifier.

For substantially reduced and/or canceled third order nonlinearities in the output signal 120 in the embodiment of FIG. 3, the third order output intercept points of the first amplifier 104 and second amplifier 106 are designed such that most nearly $2(OIP3_{104} - OIP3_{106}) = 3(G_{104} - G_{106})$, where $OIP3_{104}$ and $OIP3_{106}$ are the third order output intercept points in dBm of the first and second amplifiers 104 and 106 respectively, and $G_{104}$ and $G_{106}$ are the gains in dB of the first and second amplifiers, respectively. Typically, it is desirable to have $G_{104}$ much greater than $G_{106}$, or $G_{106}$ much greater than $G_{104}$, so that the gain is not greatly reduced in the overall embodiment of FIG. 3. As is well known by one practiced in the art, the embodiment of FIG. 3 can be rearranged to perform the same function by interchanging the in-phase splitter 102 and 180-degree out-of-phase combiner 108 such that first and second signals 112 and 114 are 180 degrees out of phase, and such that the first and second amplified output signals 116 and 118 are combined in phase. As would be apparent to one practiced in the art, the nonlinear devices may be of differing type, for example the first nonlinear device may be an amplifier and the second nonlinear device may be a diode. As is also well known in the art, the amplifiers shown in FIG. 3 can be replaced by any other nonlinear device, such as mixers, multi-stage amplifiers, and the like, where such circuits are similarly characterized for gains $G_{104}$ and $G_{106}$ and third order output intercept points $OIP3_{104}$ and $OIP3_{106}$. As is also well known in the art, phase adjusting means, bias adjusting means, and amplitude adjusting means can be added to the apparatus of FIG. 3 to provide fine resolution adjustment to more precisely cancel the undesired nonlinear distortions.

For illustrative purposes only in FIG. 3, the frequency spectrum of various signals are illustrated in input spectrum 130, first output spectrum 132, second output spectrum 134, and final output spectrum 136. As an illustrative example, the input spectrum is shown for the input signal 110 comprising two input spectral lines of equal amplitude at different frequencies. The spectrum at the first amplified output signal 116 of the first amplifier 104 is illustrated in the first output spectrum, where the two innermost spectral lines correspond to the original input frequencies illustrated in the input spectrum, but with increased amplitude, and the two outermost spectral lines representing third-order distortion components of the first amplified output signal. The spectrum at the second amplified output signal 118 of the second amplifier 106 is illustrated in the second output spectrum, where the two innermost spectral lines correspond to the original input frequencies illustrated in the input spectrum, but with increased amplitude, and the two outermost spectral lines represent third-order distortion components of the second amplified output signal 118. The gains and nonlinearities of the first and second amplifiers are adjusted such that the nonlinear distortion components of the first and second output spectrum are of equal amplitude and in-phase, while the innermost spectral lines corresponding to linear components of the first and second output spectrum are of unequal amplitude. The spectrum of the final output signal 120 of the 180-degree out-of-phase combiner 108 is illustrated in the final output spectrum where the two spectral lines correspond to an amplified version of the input spectrum and all distortion products shown in the first and second output spectrum are canceled and eliminated.

In an alternate embodiment of the invention, similar in schematic representation to that shown in FIG. 3 and described above, the nonlinear devices, in this application the amplifiers are designed to substantially reduce and/or cancel nonlinearities of any desired order. As is well known in the art, amplifiers can be designed for varying levels of distortion, including third order nonlinear distortion, by adjusting current and voltage bias levels of components within the amplifier and by selection or design of the components used within the amplifier. The first amplifier 104 is designed such that it has a Taylor series expansion describing the first amplified output signal 116, denoted as $y_1 = a_0 + a_1 x + a_2 x^2 + a_3 x^3 + a_4 x^4 \ldots$ where the first amplified output signal (i.e., voltage, etc.) is denoted as $y_1$, and where the first signal 112, being the input signal (i.e., voltage, etc.) to the first amplifier, is denoted as x. The second amplifier 106 is designed such that it has a Taylor series expansion describing the second amplified output signal 118, denoted as $y_2 = b_0 + b_1 x + b_2 x^2 + b_3 x^3 + b_4 x^4 \ldots$ where the second amplified output signal is denoted as $y_2$, and where the second signal 114, being the input of the second amplifier, is denoted as x since the first signal 112 equals the second signal 114. The coefficients $a_0, a_1, a_2, a_3, a_4 \ldots$ describe the first amplifier and coefficients $b_0, b_1, b_2, b_3, b_4 \ldots$ describe the second amplifier. Third order nonlinearity is then substantially reduced and/or canceled in the final output signal 120 by designing the first and second amplifiers such that most nearly $a_3 - b_3 = 0$, or $a_3 = b_3$. To retain the desired linear output signal components, the first and second amplifiers are also designed such that $a_1 - b_1$ does not equal zero. Typically, it is desirable to have $a_1$ much greater than $b_1$, or alternatively $b_1$ much greater than $a_1$, so that the gain is not greatly reduced in the overall embodiment of FIG. 3.

Similarly, other order nonlinearities can be substantially reduced and/or canceled using the foregoing method. In particular, the second order nonlinearity can be substantially reduced and/or canceled by selecting most nearly $a_2 - b_2 = 0$, or $a_2 = b_2$. Alternatively, the fourth order nonlinearity can be substantially reduced and/or canceled by selecting most nearly $a_4 - b_4 = 0$, or $a_4 = b_4$. Higher order nonlinearities of order n can also be substantially reduced and/or canceled with the same design methods by using Taylor series expansions to higher order terms, and canceling the undesired order nonlinearity by setting $a_n = b_n$.

As is well known by one practiced in the art, the embodiment of FIG. 3 can be rearranged to perform the same function for odd order products by interchanging the in-phase splitter 102 and 180-degree out-of-phase combiner 108 such that the first and second signals 112 and 114 are 180 degrees out of phase, and such that first and second amplified output signals 116 and 118 are combined in phase. As is well known in the art, the amplifiers shown in FIG. 3 can be replaced by any other nonlinear device, such as mixers, multi-stage amplifiers, and the like, where such nonlinear devices are similarly characterized for their Taylor series expansion. Additionally, phase adjusting means, bias adjusting means and amplitude adjusting means can be added to provide fine resolution adjustment to more precisely cancel the undesired nonlinear distortions.

FIG. 4 illustrates a schematic representation of an apparatus for substantially reducing and/or canceling nonlinearities, in accordance with another embodiment of the present invention. The apparatus 140 includes a coupling means 142, a first nonlinear device, such as first amplifier 144, a second nonlinear device, such as second amplifier 146 and a subtractor 148. The coupling means 142 splits the input signal 150 into first and second in-phase signals 152 and 154. The coupling means results in second in-phase signal (i.e., voltage, etc.) that is a constant factor, k, times the first in-phase signal. The first in-phase signal is applied as input to the first amplifier 144, and the second in-phase signal is applied as input to the second amplifier 146. A first amplified output signal 156 of the first amplifier is combined with the second amplified output signal 158 of the second amplifier in a subtractor 148, such that the second amplified output signal 158 is subtracted from the first amplified output signal 156 to generate the final output signal 160.

The first and second amplifiers 144 and 146 and the coupling factor, k, of the coupling means 142 are designed such that the input signal 150 is not canceled and eliminated in the subtractor 148. In addition, the first and second amplifiers, and the coupling means, are designed with substantially equal time delay and phase and such that one of the nonlinear distortion components, i.e., third order nonlinear distortion, of first and second amplified output signals 156 and 158 has equal amplitudes at the outputs of the first and second amplifiers. In the particular embodiment of the invention in which third order distortion is substantially reduced and/or canceled in the final output signal 160, the first and second amplifiers 144 and 146, and the coupling means 142, are designed such that the third order distortion components are equal at the first and second amplified output signals 156 and 158. As is well known in the art, amplifiers can be designed for varying levels of distortion, including third order nonlinear distortion, by adjusting current and voltage bias levels of components within the amplifier and by selection or design of the components used within the amplifier. In addition, the coupling means can be readily designed by one practiced in the art using unequal power dividers, resistive networks, and the like. In addition, the subtractor can be readily designed by one practiced in the art using 180-degree hybrids, cross-coupled collectors in integrated circuit bipolar transistor differential amplifiers, cross-coupled drains in integrated circuit metal-oxide field-effect transistor differential amplifiers, and the like. For substantially reduced and/or canceled third order nonlinearities in the final output signal 160 the third order output intercept points of the first and second amplifiers 144 and 146 are designed such that most nearly $2(OIP3_{144} - OIP3_{146}) = 3(G_{144} - G_{146} - K)$, where $OIP3_{144}$ and $OIP3_{146}$ are the third order output intercept points in dBm of the first and second amplifiers, respectively, and $G_{144}$ and $G_{146}$ are the gains in dB of first and second amplifiers, respectively, and $K=10 \log_{10}(p_{154}/p_{152})$ where $p_{152}$ and $p_{154}$ are the power levels in milliwatts of first and second in-phase signals 152 and 154 respectively. Typically, it is desirable to have $G_{144}$ much greater than $G_{146}+K$, or $G_{146}+K$ much greater than $G_{144}$, so that the gain is not greatly reduced in the overall embodiment of FIG. 4.

As is well known by one practiced in the art, the embodiment of FIG. 4 can be rearranged to perform the same function by interchanging the coupling means 142 and subtractor 148 such that first and second signals 152 and 154 are 180 degrees out of phase, and such that first and second amplified signals 156 and 158 are combined in phase. As is well known in the art, the amplifiers shown in FIG. 4 can be replaced by any other nonlinear device, such as mixers, multi-stage amplifiers, and the like, where such nonlinear devices are similarly characterized for gains $G_{144}$ and $G_{146}$ and third order output intercept points $OIP3_{144}$ and $OIP3_{146}$. As would be apparent to one practiced in the art, the nonlinear devices may be of differing type, for example the first nonlinear device may be an amplifier and the second nonlinear device may be a diode. Additionally, phase adjusting means, bias adjusting means and amplitude adjusting means can be added to the FIG. 4 embodiment to provide fine resolution adjustment to more precisely cancel the undesired nonlinear distortions.

In an alternate embodiment of the invention, similar in schematic representation to that shown in FIG. 4 and described above, the amplifiers are designed to substantially reduce and/or cancel nonlinearities of any desired order. The first amplifier 144 is designed such that it has a Taylor series expansion describing the first amplified output signal 156, denoted as $y_1=a_0+a_1x+a_2x^2+a_3x^3+a_4x^4$ ... where the first amplified output signal (i.e., voltage, etc.) is denoted as $y_1$, and where the first in-phase signal 152, being the input signal (i.e., voltage, etc.) of the first amplifier, is denoted as x. The second amplifier 146 is designed such that it has a Taylor series expansion describing the second amplified output signal 158, denoted as $y_2=b_0+b_1(kx)+b_2(kx)^2+b_3(kx)^3+b_4(kx)^4$ ... where the second amplified output signal is denoted $y_2$, and where the second in-phase signal 154 is denoted kx since the second in-phase signal equals the first in-phase signal times a constant factor, k, where k is set by the design of the coupling means 142. The final output is formed by the subtractor 148 to generate the final output signal 160 that is the subtraction of the second amplified output signal from first amplified output signal. The coefficients $a_0, a_1, a_2, a_3, a_4$ ... describe the first amplifier and coefficients $b_0, b_1, b_2, b_3, b_4$ ... describe the second amplifier. Third order nonlinearity is then substantially reduced and/or canceled in the final output signal by setting the coupling coefficient, k, in the coupling means such that most nearly $a_3-b_3k^3=0$, or $k=(a_3/b_3)^{1/3}$. The desired linear output signal is then represented by the terms $a_1x-b_1(kx)=(a_1-b_1k)x$, where the coupling coefficient, k, and amplifier coefficients are selected such that $a_1-b_1k$ does not equal zero, and $a_3-b_3k^3$ equals zero.

Similarly, other order nonlinearities can be substantially reduced and/or canceled using the foregoing method. In particular, the second order nonlinearity can be substantially reduced and/or canceled by selecting most nearly $a_2-b_2k^2=0$, or $k=(a_2/b_2)^{1/2}$. Alternatively, the fourth order nonlinearity can be substantially reduced and/or canceled by selecting most nearly $a_4-b_4k^4=0$, or $k=(a_4/b_4)^{1/4}$. Higher order nonlinearities of order n can also be substantially reduced and/or canceled with the same methods by using Taylor series expansions to higher order terms and most nearly setting $k=(a_n/b_n)^{1/n}$.

As is well known in the art, the amplifiers shown in FIG. 4 can be replaced by any other nonlinear device, such as mixers, multi-stage amplifiers, and the like, where such nonlinear devices are similarly characterized their Taylor series expansion. Additionally, phase adjusting means, bias adjusting means and amplitude adjusting means can be added to provide fine resolution adjustment to more precisely cancel the undesired nonlinear distortions.

FIG. 5 is flow diagram that represents a method 500 for substantially reducing and/or canceling third order nonlinear distortion, in accordance with an embodiment of the present invention. In the first step, 510, an input signal is split by an input coupling means into first and second in-phase coupled signals with the ratio of the second coupled signal power, $p_2$, to the first coupled signal power, $p_1$, being $K=10 \log_{10}(p_2/p_1)$ dB. The first and second signal powers being typically defined in milliwatts. As is well known in the art, the input coupling means used to split the input signal can be readily designed using unequal power dividers, resistive networks, hybrids, and the like.

In the second step, 520 the first coupled signal is processed by a first nonlinear device, such as an amplifier or the like, having a gain, $G_1$ dB, and third order output intercept point $OIP3_1$ dBm and the second coupled signal is processed by a second nonlinear device, such as an amplifier or the like, having a gain, $G_2$ dB, and third order output intercept point $OIP3_2$ dBm. Further, the first and second amplifiers and the input coupling means will have the following relationship, most nearly $2(OIP3_1-OIP3_2)=3(G_1-G_2-K)$, where $G_1$ is not equal to $G_2+K$. The condition $2(OIP3_1-OIP3_2)=3(G_1-G_2-K)$ is for substantial reduction and/or cancellation of third order nonlinear distortion products. The condition of $G_1$ being not equal to $G_2+K$ assures that the linear signal is not canceled. In typical applications it is desirable that $G_1$ be much greater than $G_2+K$, such that the linear gain of the overall method 500 is not greatly reduced and is approximately equal to $G_1$, and with substantially equal time delay and phase in the two nonlinear signal paths. As is well known in the art, amplifiers can be designed for varying levels of distortion, including third order nonlinear distortion, by adjusting current and voltage bias levels of components within the amplifier and by selection or design of the components used within the amplifier.

In the third step, 530 the output signal of the second amplifier, $y_2$, is subtracted from the output signal of the first amplifier, $y_1$ to yield a final output signal, $y=y_2-y_1$. In effect, the subtraction substantially reduces and/or cancels the third order intermodulation distortion that is present in the output signals of the first and second amplifiers. The method 500 can be modified to perform the same function for third order cancellation by providing for an input coupling means whose first and second coupled signals are 180 degrees out of phase and providing for an adder, as opposed to a subtractor, as the output coupling means. Additionally, the alternate steps of phase adjusting, bias adjusting and amplitude adjusting may also be performed in accordance with method 500 to provide fine resolution adjustment to more precisely cancel the undesired nonlinear distortions.

FIG. 6 is flow diagram that represents an alternate method 600 for substantially reducing and/or canceling third order nonlinear distortion, in accordance with an embodiment of the present invention. In the first step, 610, an input signal is split into first and second in-phase coupled signals at an input coupling means with the ratio of the second coupled signal (i.e., voltage, etc.), $x_2$, to the first coupled signal (i.e., voltage, etc.), $x_1$, being $k=x_2/x_1$. As is well known in the art, the coupling means employed to split the input signal can be readily designed using unequal power dividers, resistive networks, hybrids, and the like. As is also well known in the art, signal currents can be used in place of signal voltages.

In the second step, 620 the first coupled signal is processed by a first nonlinear device, such as a first amplifier or the like, having a Taylor series expansion, $y^1=a_0+a_1x_1+a_2x_1^2+a_3x_1^3+a_4x_1^4\ldots$, and the second coupled signal is processed by a second nonlinear device, such as second amplifier having a Taylor series expansion, $y^2=b_0+b_1x_2+b_2x_2^2+b_3x_2^3+b_4x_2^4\ldots$ where $y_1$ and $y_2$ are the output signals (i.e., voltage, etc.), and where $x_1$ and $x_2$ are the input signals (i.e., voltage, etc.) of the first and second amplifiers respectively. Further, the first and second amplifiers and the input coupling means will have the following relationship, most nearly $k=(a_n/b_n)^{1/n}$ in order to substantially reduce and/or cancel nonlinear distortion products of order n, and designed where $a_1$ is not equal to $kb_1$. The condition that $k=(a_n/b_n)^{1/n}$ is for substantial reduction and/or cancellation of nonlinear distortion products of order n. The condition of $a_1 \neq kb_1$ assures that the linear signal is not canceled. In typical applications it is desirable that $a_1$ be much greater than $kb_1$, such that the linear gain of the overall method 600 is not greatly reduced and is approximately equal to $a_1$, and with substantially equal time delay and phase in the two nonlinear devices. As would be apparent to one of ordinary skill in the art, the nonlinear devices may be of differing type, for example the first nonlinear device may be an amplifier and the second nonlinear device may be a diode. As is well known in the art, amplifiers can be designed for varying levels of distortion, including third order nonlinear distortion, by adjusting current and voltage bias levels of components within the amplifier and by selection or design of the components used within the amplifier.

In the third step, 630 the output signal of the second amplifier, $y_2$, is subtracted from the output signal of the first amplifier, $y_1$ to yield a final output signal, $y=y_2-y_1$. In effect, the subtraction substantially reduces and/or cancels intermodulation distortion of order n that is present in the output signals of the first and second amplifiers. The method 600 can be modified to perform the same function for odd values of n by providing for an input coupling means whose first and second coupled signals are 180 degrees out of phase and providing for an adder, as opposed to a subtractor, as the output coupling means. Additionally, the alternate steps of phase adjusting, bias adjusting and amplitude adjusting may also be performed as steps of method 600 to provide fine resolution adjustment to more precisely cancel the undesired nonlinear distortions.

Another embodiment of the invention is illustrated in the schematic diagram of FIG. 7. An apparatus 170 for substantially reducing and/or canceling nonlinearities includes a nonlinear load 172 and nonlinear device 174. The nonlinear load 172 is designed such that it has a Taylor series expansion describing the current through the nonlinear load, denoted $i_L$, where $i_L=a_0+a_1v_L+a_2v_L^2+a_3v_L^3+a_4v_L^4\ldots$ and where the terminal voltage of the nonlinear load is denoted as $v_L$, the terminal voltage being coupled to the final output signal 176. The nonlinear device 174 is designed such that it has a Taylor series expansion describing its output current denoted, $i_o$, where $i_o=b_0+b_1v+b_2v^2+b_3v^3+b_4v^4\ldots$ and where the input voltage signal 178 is denoted as v. The coefficients $a_0, a_1, a_2, a_3, a_4 \ldots$ describe the nonlinear load 172 and coefficients $b_0, b_1, b_2, b_3, b_4 \ldots$ describe the nonlinear device 174. Therefore, $i_L=i_o$ and $a_0+a_1v_L+a_2v_L^2+a_3v_L^3+a_4v_L^4\ldots=b_0+b_1v+b_2v^2+b_3v^3+b_4v^4\ldots$. As is well known in the art, such Taylor series expansions are used to describe nonlinear devices as bipolar transistors, field effect transistors, and the like, and are used to describe such nonlinear load devices as diodes, diode-connected transistors, and the like. As is also well known in the art, signal currents can be used in place of signal voltages. All order nonlinearities at the output signal 176 are then substantially reduced and/or canceled from the output signal voltage by providing for the nonlinear device 174 and nonlinear load 172 such that most nearly $b_0=a_0$, $b_1=ca_1$, $b_2=c^2 a_2$, $b_3=c^3a_3 \ldots b_n=c^n a_n$ where c is a constant. Under these conditions, the voltage, $v_L$, across the nonlinear load 172 is most nearly c times the input voltage signal, i.e., $v_L=cv$. The small-signal output signal voltage 176 is 180-degrees phase shifted, i.e., equals $-v_L$, if the nonlinear load is connected to a power supply acting as a small-signal virtual ground. Additionally, phase adjusting means, bias adjusting means and amplitude adjusting means can be added to the apparatus 170 to provide fine resolution adjustment to more precisely cancel the undesired nonlinear distortions.

Another embodiment of the invention is illustrated in the schematic diagram of FIG. 8. An apparatus 180 for substantially reducing and/or canceling nonlinearities of any order includes a nonlinear load composed of first and second diode-connected n-channel field effect transistors (FETs), 182 and 184, and a nonlinear device comprised of n-channel field effect transistor 186. A constant voltage power supply signal Vdd is present as signal 188. All three transistors 182, 184, and 186 are typically designed such that they are near identical devices. Input voltage signal 190 comprises an AC (alternating current) signal voltage component, in addition to a DC (direct current) bias voltage, as is well known in the art. The AC component of output voltage signal 192 is most nearly −2 times (−2×) the AC component of input voltage signal 190, with all nonlinear distortion components substantially reduced and/or canceled at the output signal 192. As would be readily apparent to one practiced in the art, other gains may be achieved by using a different number of transistors in place of the first and second diode-connected, n-channel FETs 182 and 184, or by using scaled lengths and widths of the gates of field effect transistors in integrated circuit implementations. For illustration purposes, the FETs are shown as n-channel enhancement-mode metal-oxide semiconductor field effect transistors. As would be readily apparent to one practiced in the art, the transistors may be implemented using p-channel devices, GaAs field effect transistors, Heterojunction Bipolar Transistors, bipolar junction transistors, and the like. Additionally, integrated circuit implementation may preferentially use transistor devices with each transistor's source connected to its own bulk or its own well to avoid backgate effect.

Another embodiment of the invention is illustrated in the schematic diagram of FIG. 9. An apparatus 200 for substantially reducing and/or canceling nonlinearities of any order includes a nonlinear load composed of first and second diode-connected npn bipolar junction transistors, 202 and 204, and a nonlinear device composed of npn bipolar junction transistor 206 that are used to substantially reduce and/or cancel nonlinearities of all orders. A constant voltage power supply signal Vcc is present as signal 208. Input voltage signal 210 includes an AC voltage signal component, in addition to a DC bias voltage component, as is well known in the art. All three transistors 202, 204, and 206 are designed such that they are near identical devices. The AC component of output voltage signal 212 is most nearly −2 times (−2×) the AC component of input voltage signal 210, with all nonlinear distortion components substantially reduced and/or canceled at the output signal 212.

As would be readily apparent to one practiced in the art, other gains may be achieved by using a different number of transistors in place of first and second diode-connected npn bipolar junction transistors 202 and 204, or by using scaled geometries of bipolar transistors in integrated circuit implementations. It is preferential for the currents of all three devices to be more nearly equal, and, thus, for the beta, or current gain, of all three devices 202, 204 and 206 to be as large as possible. As would be apparent to one practiced in the art, the transistors may be implemented using n-channel field effect devices, p-channel field effect devices, GaAs FET, Heterojunction Bipolar Transistors, and the like. Additionally, phase adjusting means, bias adjusting means and amplitude adjusting means can be added to the apparatus of FIG. 9 to provide fine resolution adjustment to more precisely cancel the undesired nonlinear distortions.

FIG. 10 is flow diagram that represents an alternate method 700 for substantially reducing and/or canceling all nonlinear distortion, in accordance with an embodiment of the present invention. In the first step, 710, an input voltage, which may also include a DC bias voltage in addition to AC signal components, is applied to a nonlinear device where the current $i_o$ of the nonlinear device is coupled such that it is equal to the current $i_L$ of a nonlinear load. The nonlinear device will provide for a Taylor series expansion that describes its output current $i_o$ as $i_o = b_0 + b_1 v + b_2 v^2 + b_3 v^3 + b_4 v^4 \ldots$ where the input voltage signal is denoted as v and coefficients $b_0, b_1, b_2, b_3, b_4 \ldots$ describe the nonlinear device. As is well known in the art, such Taylor series expansions are used to describe nonlinear devices such as bipolar transistors, field effect transistors and the like.

At step 720, the output current ($i_o$) of the nonlinear device is coupled to a nonlinear load device such that the output current ($i_o$) is equal to the current ($i_L$) of the non-linear load. The nonlinear load will have a Taylor series expansion that relates to the terminal voltage, denoted $v_L$, as $i_L = a_0 + a_1 v_L + a_2 v_L^2 + a_3 v_L^3 + a_4 v_L^4 \ldots$ where current through the nonlinear load is denoted as $i_L$ and coefficients $a_0, a_1, a_2, a_3, a_4 \ldots$ describe the nonlinear load. As is well, known in the art, such Taylor series expansions are used to describe such nonlinear load devices such as diodes, diode-connected transistors and the like. The nonlinear device and the nonlinear load are provided for such that most nearly $b_0 = a_0$, $b_1 = ca_1$, $b_2 = c^2 a_2$, $b_3 = c^3 a_3 \ldots b_n = c^n a_n$ where c is a constant. Under these conditions, all nonlinear terms and nonlinear signal distortions are substantially reduced and/or canceled in the output signal $v_L$.

At step 730, a voltage is output that is taken to be the voltage across the nonlinear load, $v_L$. As noted above, the output signal substantially reduces and/or cancels all nonlinear terms and nonlinear signal distortions. Additionally, the steps of phase adjusting, bias adjusting and amplitude adjusting can be added to provide fine resolution adjustment to more precisely cancel the undesired nonlinear distortions.

FIG. 11 illustrates a schematic diagram of an apparatus to substantially reduce and/or cancel nonlinear distortion, in accordance with an alternate embodiment of the present invention. The apparatus 220 comprises a first nonlinear device, such as first amplifier 222, coupling means 224, a second nonlinear device, such as second amplifier 226 and a subtractor 228. In operation, an input signal 230 is transmitted to the first amplifier, the first amplifier provides for a Taylor series expansion describing a first amplified output signal 232 (i.e., voltage, etc.), denoted as $y_1 = a_0 + a_1 x + a_2 x^2 + a_3 x^3 + a_4 x^4 \ldots$ where the input signal (i.e., voltage, etc.) of the first amplifier is denoted as x. The first amplified output signal of the first amplifier is then split into first and second in-phase coupled signals 234 and 236 by coupling means 224. The first in-phase coupled signal 234 (i.e., voltage, etc.) equals the second in-phase coupled signal 236 (i.e., voltage, etc.) times a constant factor, k, set by the design of the coupling means; and for the purpose of illustrating the embodiment, let the second in-phase coupled signal 236 equal the first amplified output signal 232. The second amplifier 226 provides for a Taylor series expansion describing the second amplified output signal 238, denoted as $y_2 = b_0 + b_1 (x_2) + b_2 (x_2)^2 + b_3 (x_2)^3 + b_4 (x_2)^4 \ldots$ where the input signal 234 of the second amplifier is denoted as $x_2$. The final output signal 240 is formed by the subtractor 228, where the final output signal 240 is the second amplified output signal subtracted from the second in-phase coupled signal. As is also well known in the art, signal currents can be used in place of signal voltages.

The coefficients $a_0, a_1, a_2, a_3, a_4 \ldots$ describe the first amplifier 222 and coefficients $b_0, b_1, b_2, b_3, b_4 \ldots$ describe the second amplifier 226. Third order nonlinearity is then substantially reduced and/or canceled in the final output signal 240 by setting the coupling coefficient k in the circuit such that most nearly $a_3 - a_3 b_1 k - 2 a_1 a_2 b_2 k^2 - a_1^3 b_3 k^3 = 0$. Alternatively, second order nonlinearity is substantially reduced and/or canceled in the final output signal by setting the coupling coefficient k in the circuit such that most nearly $a_2 - a_2 b_1 k - a_1^2 b_2 k^2 = 0$. The desired linear output signal is then represented by the terms $a_1 x - a_1 b_1 (kx) = (a_1 - a_1 b_1 k)_x$, where the coupling coefficient k and amplifier coefficients are selected such that $a_1 - a_1 b_1 k$ does not equal zero. Similarly, higher order nonlinearities of order n can also be substantially reduced and/or canceled with the same methods by using Taylor series expansions to higher order terms and solving for the coefficients of the apparatus in FIG. 11.

The coupling means 224 can be provided using unequal power dividers, resistive networks and the like. The subtractor 228 can be provided using 180 degree hybrids, cross-coupled collectors in integrated circuit bipolar transistor differential amplifiers, cross-coupled drains in integrated circuit MOSFET (metal oxide semiconductor field-effect transistor) differential amplifiers, and the like. The first and second amplifiers shown in FIG. 11 can be replaced by any other nonlinear device, such as mixers, multi-stage amplifiers, and the like, where such devices are similarly characterized their Taylor series expansion. Additionally, phase adjusting means, bias adjusting means and amplitude adjusting means can be added to the apparatus of FIG. 11 to provide fine resolution adjustment to more precisely cancel the undesired nonlinear distortions.

FIG. 12 illustrates a schematic diagram of an apparatus for substantially reducing and/or canceling nonlinearities, in accordance with an embodiment of the present invention. The apparatus 250 includes a coupling means 252, a first nonlinear device, such as first amplifier 254, a subtractor 256 and a second nonlinear device, such as second amplifier 258. In operation, the input signal 260 is split into first and second in-phase coupled signals 262 and 264 by coupling means 252. The second in-phase coupled signal 264 is input into first amplifier 254. The first amplifier is designed such that it has a Taylor series expansion describing the first amplified output signal 266, denoted as $y_2 = b_0 + b_1 x_2 + b_2 x_2^2 + b_3 x_2^3 + b_4 x_2^4 \ldots$ where the input signal of the first amplifier is denoted $x_2$ and where the second in-phase coupled signal (i.e., voltage, etc.) equals the first in-phase coupled signal (i.e., voltage, etc.) times a constant factor, k, set by the design of the coupling means. The coefficients $b_0, b_1, b_2, b_3, b_4, \ldots$ describe the first amplifier. The first in-phase coupled signal 262 and the first amplified output signal are input into subtractor 256. The subtractor forms subtracted output signal 268 by the subtraction of the first amplified output signal from the first in-phase coupled signal. The subtracted output signal is then input into the second amplifier 258 resulting in the ouput of the final output signal 270. The second amplifier 254 is designed such that it has a Taylor series expansion describing the final output signal 270 denoted as $y_1$, where $y_1=a_0+a_1x_1+a_2x_1^2+a_3x_1^3+a_4x_1^4$ . . . where the subtracted output signal 268 is denoted as $x_1$. The coefficients $a_0$, $a_1$, $a_2$, $a_3$, $a_4$, . . . describe the second amplifier. As is also well known in the art, signal currents can be used in place of signal voltages.

Third order nonlinearity is substantially reduced and/or canceled in the final output signal 270 by setting the coupling coefficient k in the apparatus such that most nearly $2a_2b_1b_2k^3-2a_2b_2k^2-a_1b_3k^3+a_3-3a_3b_1k+3a_3b_1^2k^2-a_3b_1^3k^3=0$. Alternatively, second order nonlinearity is substantially reduced and/or canceled in the final output signal by setting the coupling coefficient k in the circuit such that most nearly $a_2b_1^2k^2-a_1b_2k^2-2a_2b_1k+a_2=0$. The coupling coefficient k and amplifier coefficients are selected such that $a_1-a_1b_1k$ does not equal zero, i.e., to prevent cancellation of the desired linear term. Similarly, higher order nonlinearities of order n can also be substantially reduced and/or canceled with the same methods by using Taylor series expansions to higher order terms and solving for the coefficients of the apparatus in FIG. 12. As is well known in the art, the amplifiers shown in FIG. 12 can be replaced by any other nonlinear device, such as mixers, multi-stage amplifiers, and the like, where such devices are similarly characterized their Taylor series expansion. Additonally, phase adjusting means, bias adjusting means and amplitude adjusting means can be implemented in the apparatus of FIG. 12 to provide fine resolution adjustment to more precisely cancel the undesired nonlinear distortions.

FIG. 13 depicts a flow diagram of a method 800 for substantially reducing and/or canceling third order nonlinear distortions, in accordance with an embodiment of the present invention. In the first step 810, an input signal is transmitted to a first nonlinear device, such as an amplifier, having a Taylor series expansion $y_1=a_0+a_1x_1+a_2x_1^2+a_3x_1^3+a_4x_1^4$ . . . where $y_1$ denotes the output (i.e., voltage, etc.) of the first nonlinear device and $x_1$ denotes the input (i.e., voltage, etc.) of the first nonlinear device. As is well known in the art, nonlinear devices, such as amplifiers, can be designed for varying levels of distortion, including third order nonlinear distortion, by adjusting current and voltage bias levels of components within the device and by selection or design of the components used within the device. As is also well known in the art, signal currents can be used in place of signal voltages.

At step 820, the output of the first nonlinear device is split, at a first coupling means, resulting in first and second in-phase coupled signals. The ratio of the first coupled signal to the second coupled signal being k; and for purposes of illustrating the embodiment, the second in-phase coupled signal equals the output of the first nonlinear device. As is well known in the art, the coupling means can be readily designed using unequal power dividers, resistive networks, and the like.

At step 830, the first coupled output is transmitted to a second nonlinear device, such as an amplifier, having a Taylor series expansion $y_2=b_0+b_1x_2+b_2x_2^2+b_3x_2^3+b_4x_2^4$ . . . where $y_2$ denotes the output (i.e., voltage, etc.) of the second nonlinear device and $x_2$ denotes the input (i.e., voltage, etc.) of the second nonlinear device. The first and second nonlinear device and first coupling means may be provided such that most nearly $a_3-a_3b_1k-2a_1a_2b_2k^2-a_1^3b_3k^3=0$ to substantially reduce and/or cancel third order distortion products in the final output signal. Alternatively, if second order nonlinearity is desired to be substantially reduced and/or canceled in the final output signal, the coupling coefficient k will be set in the circuit such that that most nearly $a_2-a_2b_1k-a_1^2b_2k_2=0$. In either case of eliminating third or second order nonlinear distortion, the coupling coefficient k and nonlinear device coefficients are selected such that $a_1-a_1b_1k$ does not equal zero. Similarly, higher order nonlinearities of order n can also be substantially reduced and/or canceled with the same methods by using Taylor series expansions to higher order terms and solving for the coefficients of the apparatus in FIG. 11.

At step 840, the output of the second nonlinear device and the second coupled output are coupled, at a second coupling means, resulting in a final output. The final output signal is a result of subtracting, at the second coupling means, the output of the second nonlinear device from the second coupled output signal of the first coupling means. The intermodulation distortion are then substantially reduced and/or canceled at the final output signal. As is well known by one practiced in the art, method 800 can be modified to perform the same function with other order nonlinearities by similarly canceling Taylor series associated with order n distortion products. Additionally, a step for phase adjusting, bias adjusting and/or amplitude adjusting can be added to method 800 to provide fine resolution adjustment to more precisely cancel the undesired nonlinear distortions.

FIG. 14 illustrates a flow diagram of a method 900 for substantially reducing and/or canceling nonlinear distortion, in accordance with an embodiment of the present invention. In the first step 910, an input signal is transmitted to an input coupling means that splits the input signal into first and second in-phase coupled signals, with the ratio of the second coupled signal to the first coupled signal being k. As is well known in the art, the coupling means can be readily designed using unequal power dividers, resistive networks, and the like.

At step 920, the second coupled signal is transmitted to a first nonlinear device, such as an amplifier, having a Taylor series expansion $y_2=b_0+b_1x_2+b_2 x_2^2+b_3x_2^3+b_4x_2^4$ . . . where $y_2$ denotes the output of the first nonlinear device and $x_2$ denotes the input of the first nonlinear device. As is well known in the art, nonlinear devices, such as amplifiers, can be designed for varying levels of distortion, including third order nonlinear distortion, by adjusting current and voltage bias levels of components within the device and by selection or design of the components used within the device. As is also well known in the art, signal currents can be used in place of signal voltages.

At step 930, the first coupled signal and the output signal of the first amplifier is transmitted to a second coupling means to subtract the output signal of the first amplifier from the first coupled signal to result in a difference signal.

At step 940, the difference signal is transmitted to the second nonlinear device, such as an amplifier, having a Taylor series expansion $y_1=a_0+a_1x_1+a_2x_1^2+a_3x_1^3+a_4x_1^4$ . . . where $y_1$ denotes the output of the second nonlinear device and $x_1$ denotes the input of the second nonlinear device. The output of the second nonlinear device being the final output signal which is devoid of intermodulation distortion. The first and second nonlinear devices and input coupling means are provided such that most nearly $2a_2b_1b_2k^3-2a_2b_2k^2-a_1b_3k^3+a_3-3a_3b_1k+3a_3b_1^2k^2-a_3b_1^3k^3=0$ to substantially reduce and/or cancel third order distortion products in the final output signal. Alternatively, second order nonlinearity is substantially reduced and/or canceled in the final output signal by setting the coupling coefficient k in the circuit such that, most nearly $a_2b_1^2k^2-a_1b_2k^2-2a_2b_1k+a_2=0$. In either case of eliminating third or second order nonlinear distortion the coupling coefficient k and amplifier coefficients are selected such that $a_1-a_1b_1k$ does not equal zero.

As is well known by one practiced in the art, method 900 can be modified to perform the same function for other order nonlinearities by similarly canceling Taylor series terms associated with order n distortion products. Additionally, the steps of phase adjusting, bias adjusting and amplitude adjusting can be added to method to provide fine resolution adjustment to more precisely cancel the undesired nonlinear distortions.

FIG. 15 and FIG. 16 show test data for a prototype of the embodiment of FIG. 3. The signal spectrum in FIG. 15 corresponds to the first nonlinear device output signal 116 of FIG. 3, where two strong sinusoidal tones at frequencies of 500 megahertz and 500.05 megahertz are visible along with third order intermodulation distortion frequencies at 499.95 megahertz and 500.1 megahertz. The signal spectrum in FIG. 16 corresponds to the final output signal 120 of FIG. 3, and shows that the third order intermodulation distortion components at 499.95 megahertz and 500.1 megahertz have been substantially reduced and/or canceled in the frequency spectrum of the final output signal of FIG. 3.

FIG. 17 illustrates a schematic diagram of an apparatus substantially reducing and/or canceling nonlinear distortions. The apparatus 280 comprises cross-coupled first and second differential amplifier subcircuits 282 and 284. The first differential amplifier subcircuit 282 comprises a first n-channel field-effect transistor (FET) 286 and a first differential pair that comprises of a second and third n-channel FETs 288 and 290. The first FET has source and well connected to ground, gate connected to first input bias signal 292 and drain connected to the sources of the second and third FETs. The first input bias signal sets the current in the first n-channel FET. The second and third FETs have sources and wells all connected together and connected to the drain of the first FET, gates connected to respective differential input signal terminals 294 and 296, and drains connected to respective first and second load resistors 298 and 300 and connected to respective final differential output terminals 302 and 304.

The second differential amplifier subcircuit 284 comprises a fourth n-channel FET 306 and a second differential pair comprised of fifth and sixth n-channel FETs 308 and 310. The fourth FET has source and well connected to ground, gate connected to second input bias signal 312 and drain connected to the sources of the fifth and sixth FETs. The second input bias signal sets the current in fourth FET. The fifth and sixth FETs have sources and wells all connected together and connected to the drain of the fourth FET, gates connected to respective differential input signal terminals 294 and 296, and drains connected to respective second and first load resistors 300 and 298 and connected to respective final differential output terminals 304 and 302.

The differential input signal has a positive terminal 294 connected to the gates of the second and fifth FETs 288 and 308, and a negative terminal 296 connected to the gates of the third and sixth FETs 290 and 310.

The first load resistor 298 is connected between the power supply signal Vdd 314 and the drains of second and sixth FETs 288 and 310. The second load resistor 300 is connected between the power supply signal 314 and the drains of third and fifth FETs 290 and 308. The load resistor to transistor connections thus comprise a cross-coupled pair of differential amplifiers.

In effect, the outputs of the first and second differential pairs are subtracted. The final differential output comprises a positive final differential output terminal 304 connected to the drains of the third and fifth FETs 290 and 308 and a negative final differential output terminal 302 connected to the drains of the second and sixth FETs transistor 288 and 310. For illustration purposes, the first, second, third, fourth, fifth and sixth FETs are shown as n-channel enhancement-mode metal-oxide semiconductor field effect transistors.

For the purpose of illustrating the substantial reduction and/or cancellation of nonlinear distortion in FIG. 17, a simplified illustration of the method follows. In the absence of the fourth, fifth and sixth FETs 306, 308 and 310, the first sub-amplifier comprised of the first, second and third FETs 286, 288 and 290 and the first and second load resistors 298 and 300 can be characterized to have a third-order output intercept point in dBm denoted as $OIP3_1$ and to have a gain of $G_1$ dB. In the absence of the first, second and third FETs 286, 288 and 290, the second sub-amplifier comprised of the fourth, fifth and sixth FETs 306, 308, and 310 and the first and second load resistors can be characterized to have a third-order output intercept point in dBm denoted as $OIP3_2$ and to have a gain of $G_2$ dB. As is well known in the art, amplifiers can be designed for varying levels of gain and varying levels of distortion, including third-order nonlinear distortion, by adjusting current and voltage bias levels of devices within the amplifier, and by selection or design of the devices (particularly transistors and resistors) used within the amplifier. For substantially reducing and/or canceling third-order nonlinearities in the final differential output 302 and 304, the third-order output intercept points of the first sub-amplifier and the second sub-amplifier are designed such that most nearly $2(OIP3_1-OIP3_2)=3(G_1-G_2)$, where $OIP3_1$ and $OIP3_2$ are the third-order output intercept points in dBm of the first and second sub-amplifiers respectively, and $G_1$ and $G_2$ are the gains in dB of the first and second sub-amplifiers respectively. Typically, it is desirable to have $G_1$ much greater than $G_2$, or $G_2$ much greater than $G_1$, so that the gain is not greatly reduced in the overall embodiment of FIG. 17. As is well known in the art, the parameters $OIP3_1$, $OIP3_2$, $G_1$, and $G_2$ are established by the choice of the input bias signals 292 and 312 and by the choice of the sizes, geometries, and design of the FETs and resistors.

As would be readily apparent to one practiced in the art, the field effect transistors may be implemented using p-channel devices, GaAs field effect transistors, Heterojunction Bipolar Transistors, bipolar junction transistors, and the like. As is also well known in the art, integrated circuit implementation may preferentially use transistor devices with each transistor's source connected to its own bulk or its own well to avoid backgate effects. Additionally, the first sub-amplifier and the second sub-amplifier can be replaced by any other circuit, such as mixers, multi-stage amplifiers, and the like, where such circuits are similarly characterized for gains $G_1$ and $G_2$ and characterized for third-order output intercept points $OIP3_1$ and $OIP3_2$. Also, phase adjusting means, bias adjusting means, and amplitude adjusting means can be added to the apparatus of FIG. 17 to provide fine resolution adjustment to more precisely cancel the undesired nonlinear distortions.

As taught by the other methods and apparatus of the present invention, the first sub-amplifier and the second sub-amplifier can be represented by Taylor series expansions and nonlinear distortion of order, n, substantially reduced and/or canceled by solving for the coefficient of order, n, at the final differential output terminals, and setting the coefficient to zero.

Yet another embodiment of the invention is illustrated in the schematic diagram of FIG. 18. Shown therein is an apparatus 320 for substantially reducing and/or canceling nonlinear distortions comprising a first coupling means 322, first and second nonlinear devices, such as first and second amplifiers 324 and 326 and second coupling means 328. The first coupling means 322 splits the input signal 330 into first and second in-phase signals 332 and 334. The first coupling means results in the second in-phase signal being a constant factor, $k_1$, times the first in-phase signal. The first in-phase signal is applied as input to the first amplifier 324 and the second in-phase signal is applied as input to the second amplifier 326. A first amplified output signal 336 of the first amplifier is combined with a second amplified output signal 338 of the second amplifier in the second coupling means 328. The second coupling means subtracts the second amplified output signal, multiplied by a constant factor $k_2$, from the first amplified output signal to generate the final output signal 340 where $k_2$ is set by design of the second coupling means.

The first and second amplifiers 324 and 326, and the coupling factors, $k_1$ and $k_2$, of the respective first and second coupling means 322 and 324 are designed such that the input signal 330 is not substantially reduced and/or canceled in the second coupling means. In addition, the first and second amplifiers and the first and second coupling means are designed such that one of the nonlinear distortion components, i.e., third-order nonlinear distortion, of the first and second amplified output signals 336 and 338 is substantially reduced and/or canceled in the final output signal 340. In the particular case of substantially reducing and/or canceling third-order distortion in the final output signal, the first and second amplifiers and the first and second coupling means are designed such that the third-order distortion components are substantially reduced and/or canceled in the final output signal.

As is well known in the art, amplifiers can be designed for varying levels of distortion, including third-order nonlinear distortion, by adjusting current and voltage bias levels of components within the amplifier and by selection or design of the components used within the amplifier. In addition, the first and second coupling means can be readily designed by one practiced in the art using unequal power dividers, resistive networks, and the like. In addition, the second coupling means can be readily designed by one practiced in the art using cross-coupled collectors in integrated circuit bipolar transistor differential amplifiers, cross-coupled drains in integrated circuit metal-oxide field-effect transistor differential amplifiers, and the like.

For substantially reducing and/or canceling of third-order nonlinearities in the final output signal 340 the third-order output intercept points of the first and second amplifiers 324 and 326 are designed such that most nearly $2(OIP3_{324} - OIP3_{326} - K2) = 3(G_{324} - G_{326} - K1 - K2)$, where $OIP3_{324}$ and $OIP3_{326}$ are the third-order output intercept points in dBm of the first and second amplifiers, respectively, and $G_{324}$ and $G_{326}$ are the gains in dB of the first and second amplifiers, respectively. Additionally, $K1 = 10 \log_{10}(p_{334}/p_{332})$ where $p_{332}$ and $p_{334}$ are the power levels in milliwatts of the first and second in-phase signals 332 and 334, respectively, and $K2 = 20 \log_{10}(k_2)$, where $k_2$ is the aforementioned multiplicative factor established by the second coupling means. Typically, it is desirable to have $G_{324}$ much greater than $G_{326} + K1 + K2$, or $G_{326} + K1 + K2$ much greater than $G_{324}$, so that the gain is not greatly reduced in the overall embodiment of FIG. 18, and with substantially equal time delay and phase in the two amplifiers. The amplifiers shown in FIG. 18 can be replaced by any other nonlinear device, such as mixers, multi-stage amplifiers, and the like, where such devices are similarly characterized for gains $G_{324}$ and $G_{326}$ and third-order output intercept points $OIP3_{324}$ and $OIP3_{326}$. As would be apparent to one practiced in the art, the nonlinear devices may be of differing type, for example the first nonlinear device may be an amplifier and the second nonlinear device may be a diode. Additionally, phase adjusting means, bias adjusting means, and amplitude adjusting means can be added to the apparatus of FIG. 18 to provide fine resolution adjustment to more precisely cancel the undesired nonlinear distortions.

Another embodiment of the invention is illustrated in the schematic diagram of Figure FIG. 18, as previously described, except that the amplifiers are designed to substantially reduce and/or cancel nonlinearities of any order. The first amplifier 324 is designed such that it has a Taylor series expansion describing the first amplified output signal 336 denoted as $y_1 = a_0 + a_1 x + a_2 x^2 + a_3 x^3 + a_4 x^4 \ldots$, where the first amplified output signal is denoted $y_1$, and the first in-phase signal 332, being the input to the first amplifier, is denoted as x. The second amplifier 326 is designed such that it has a Taylor series expansion describing its output, the second amplified output signal 338 denoted as $y_2 = b_0 + b_1(k_1 x) + b_2(k_1 x)^2 + b_3(k_1 x)^3 + b_4(k_1 x)^4 \ldots$, where the second amplified output signal 338 is denoted $y_2$ and the second in-phase signal 334 is denoted $k_1 x$ since the second in-phase signal (i.e., voltage, etc.) equals the first in-phase signal (i.e., voltage, etc.) times a constant factor, $k_1$, where $k_1$ is set by the design of the first coupling means 322. The final output is formed by the second coupling means 328 to generate the final output signal 340 that is the subtraction of the second amplified output signal times a constant factor $k_2$, set by the second coupling means, from the first amplified output signal. The coefficients $a_0, a_1, a_2, a_3, a_4, \ldots$ describe the first amplifier and coefficients $b_0, b_1, b_2, b_3, b_4, \ldots$ describe the second amplifier.

Third-order nonlinearity is substantially reduced and/or canceled in the final output signal 340 by setting the coupling coefficients $k_1$ and $k_2$ in the circuit such that most nearly $a_3 - k_2 b_3 k_1^3 = 0$. The desired linear output signal is then determined by the terms $a_1 x - k_2 b_1(k_1 x) = (a_1 - k_2 b_1 k_1)_x$, where the coupling coefficients $k_1$ and $k_2$ and amplifier coefficients are selected such that $(a_1 - k_2 b_1 k_1)$ does not equal zero, and that $a_3 - k_2 b_3 k_1^3$ equals zero. Similarly, other order nonlinearities can be substantially reduced and/or canceled using the foregoing method. In particular, the second-order nonlinearity can be substantially reduced and/or canceled by selecting most nearly $a_2 - k_2 b_2 k_1^2 = 0$. Alternatively, the fourth order nonlinearity can be substantially reduced and/or eliminated by selecting most nearly $a_4 - k_2 b_4 k_1^4 = 0$. Higher order nonlinearities of order n can also be substantially reduced and/or canceled with the same methods by using Taylor series expansions to higher order terms and setting most nearly $a_n - k_2 b_n k_1^n = 0$. The amplifiers shown in FIG. 18 can be replaced by any other nonlinear device, such as mixers, multi-stage amplifiers, and the like, where such circuits are similarly characterized their Taylor series expansion. Additionally, phase adjusting means, bias adjusting means, and amplitude adjusting means can be added to the apparatus to provide fine resolution adjustment to more precisely cancel the undesired nonlinear distortions.

FIG. 19 illustrates a schematic diagram of an apparatus 350 for substantially reducing and/or canceling nonlinear distortion, in accordance with an embodiment of the present invention. The apparatus 350 comprises a first coupling means 352, first and second nonlinear devices, such as first and second amplifiers 354 and 356, adaptive control and feedback means 358 and second coupling means 360. The first coupling means 352 splits the input signal 362 into first and second in-phase signals 364 and 366. The first coupling means results in the second in-phase signal that is a constant factor, $k_1$, times the first in-phase signal. The first in-phase signal is applied as input to the first amplifier 354 and the second in-phase signal is applied as input to the second amplifier 356. A first amplified output signal 368 of the first amplifier is combined with a second amplified output signal 370 of the second amplifier in the second coupling means 360. The second coupling means subtracts the second amplified output signal, multiplied by a constant factor, $k_2$, from the first amplified output signal to generate the final output signal 372.

Also shown in the FIG. 19 embodiment is adaptive control and feedback means 358 with feedback input from the final output signal 372 and with output control signals 374, 376, 378, and 380 where the output control signals adaptively adjust the phase, amplitude, and nonlinearities of the first coupling means 352, the first amplifier 354, the second amplifier 356, and the second coupling means 360 in order to provide fine resolution adjustment to more precisely cancel the undesired nonlinear distortions by monitoring the final output signal and adjusting control signals. As is well known in the art, the feedback input, comprising the final output signal, can be alternatively taken from more advantageous signal points in larger systems incorporating the embodiment of FIG. 19, such signal points including bit error rate signals and the like.

The first and second amplifiers 354 and 356 and the coupling factors, $k_1$ and $k_2$, of the first and second coupling means 352 and 360 are designed such that the input signal 362 is not canceled and eliminated in the second coupling means. In addition, the first and second amplifiers and the first and second coupling means are designed such that one of the nonlinear distortion components, i.e., third-order nonlinear distortion, of the first and second amplified output signals 368 and 370 is substantially reduced and/or canceled in the final output signal 372. In the particular case of substantially reducing and/or canceling third-order distortion in the final output signal, the first and second amplifiers and the first and second coupling means are designed such that the third-order distortion components are substantially reduced and/or canceled in the final output signal.

As is well known in the art, first and second amplifiers 354 and 356 can be designed for varying levels of distortion, including third-order nonlinear distortion, by adjusting current and voltage bias levels of components within the amplifier and by selection or design of the components used within the amplifier. In addition, the first and second coupling means 352 and 360 can be readily designed by one practiced in the art using unequal power dividers, resistive networks, and the like. In addition, the second coupling means can be readily designed by one practiced in the art using cross-coupled collectors in integrated circuit bipolar transistor differential amplifiers, cross-coupled drains in integrated circuit metal-oxide field-effect transistor differential amplifiers, and the like.

For substantially reducing and/or canceling of third-order nonlinearities in the final output signal 372 in the embodiment of FIG. 19, the third-order output intercept points of the first and second amplifiers 354 and 356 are designed such that most nearly $2(OIP3_{354}-OIP3_{356}-K2)=3(G_{354}-G_{356}-K1-K2)$, where $OIP3_{354}$ and $OIP3_{356}$ are the third-order output intercept points in dBm of the first and second amplifiers, respectively, and $G_{354}$ and $G_{356}$ are the gains in dB of the first and second amplifiers, respectively. Additionally, $K1=10 \log_{10}(p_{366}/p_{364})$ where $p_{364}$ and $p_{366}$ are the power levels in milliwatts of the first and second in-phase signals 364 and 366, respectively, and $K2=20 \log_{10}(k_2)$, where $k_2$ is the aforementioned multiplicative factor established by the second coupling means. Typically, it is desirable to have $G_{354}$ much greater than $G_{356}+K1+K2$, or $G_{356}+K1+K2$ much greater than $G_{354}$, so that the gain is not greatly reduced in the overall embodiment of FIG. 19, and with substantially equal time delay and phase in the two amplifiers.

The amplifiers shown in FIG. 19 can be replaced by any other nonlinear device, such as mixers, multi-stage amplifiers, and the like, where such nonlinear devices are similarly characterized for gains $G_{354}$ and $G_{356}$ and third-order output intercept points $OIP3_{354}$ and $OIP3_{356}$. Additionally, phase adjusting means, bias adjusting means, and amplitude adjusting means can be added to the apparatus of FIG. 19 to provide fine resolution adjustment to more precisely cancel the undesired nonlinear distortions.

Another embodiment of the invention is illustrated in the schematic diagram of FIG. 20. Shown therein is an apparatus 400 for substantially reducing and/or canceling nonlinear distortion comprising first, second, third, and fourth nonlinear devices, such as first, second, third and fourth amplifiers, 402, 404, 406 and 408, and attenuator 410 and first and second subtractors 412 and 414. In operation, an input signal 420 is applied both to the first and second amplifiers 402 and 404, where the time delay and phase of the second amplifier substantially equals the time delay and phase of the first amplifier. The first amplified output signal 422 of the first amplifier is attenuated by the attenuator 410. The second amplified output signal 424 of the second amplifier is subtracted from the attenuated output signal 426 of the attenuator in the first subtractor 412 resulting in difference output signal 428. The first amplified output signal 422 of the first amplifier is also input to the third amplifier 406 whose time delay and phase substantially equals the time delay and phase of the fourth amplifier 408 that amplifies the difference output signal 428. The fourth amplified output signal 430 of the fourth amplifier is subtracted from the third amplified output signal 432 of the third amplifier in the second subtractor 414 to form the final output signal 434.

For illustrative purposes, an example input frequency spectrum 440 is shown for input signal 420 comprised of two input spectral lines of equal amplitude at different frequencies. The second spectrum at the first amplified output signal 422 of the first amplifier 402 is illustrated in second spectrum 442 where the two innermost spectral lines correspond to the original input frequencies illustrated in the input spectrum 440, but with larger amplitude, and the two outermost spectral lines represent third-order distortion components of the first amplified output signal. The third spectrum at the difference output signal 428 at the output of the first subtractor 412 is illustrated in third spectrum 444 where the two outermost spectral lines correspond to an attenuated version of the third-order distortion components of spectrum 442 (the two outermost spectral lines in spectrum 442) less third-order distortion components of the second amplified output signal 424 of the second amplifier 404, and the attenuation of attenuator 410 is adjusted to preferentially, but not necessarily, greatly reduce the two innermost spectral components of second spectrum 442 relative to the third-order distortion components of second spectrum 442, these two innermost spectral components appearing greatly reduced in third spectrum 444 relative to the outermost spectral components. The method is distinct from the prior art of FIG. 1 in that it allows for a widely varying range of the input spectral components (the two innermost spectral components) in the third spectrum at the difference output signal 428, and allows for the input spectral components to be larger than the third-order distortion components, although not illustrated as such. The fourth spectrum at the fourth amplified output signal 430 of the fourth amplifier 408 is illustrated in fourth spectrum 446 where the spectral lines correspond to an amplified version of third spectrum 444. The fifth spectrum at the final output signal 434 of the second subtractor 414 is illustrated in fifth spectrum 448 where the two spectral lines correspond to an amplified version of the input spectrum 440 and all distortion products in second spectrum 442 (the two outermost spectral lines in second spectrum 442) are canceled and eliminated as shown in fifth spectrum 448.

As taught by the other methods and apparatus of this invention, the third order intermodulation components are substantially reduced and/or canceled in the final output signal 434 by proper design and selection of the attenuation of the attenuator 410, and the gains, nonlinearity, and intercept points of the first, second, third and fourth amplifiers 402, 404, 406 and 408. For example, the first, second, third and fourth amplifiers 402, 404, 406 and 408 can be represented as Taylor series expansions, the attenuator represented as a constant coefficient, and nonlinear distortion of order, n, canceled by solving for the coefficient of order, n, at the final output signal 434, and setting this coefficient to zero. Additionally, phase adjusting means, bias adjusting means, and amplitude adjusting means can be added to the apparatus of FIG. 20 to provide fine resolution adjustment to more precisely cancel the undesired nonlinear distortions. As is also evident by other methods and apparatus in the invention, the embodiment of FIG. 20 can also be used to substantially reduce and/or cancel nonlinearities of any order by using Taylor series expansions for the amplifiers and by proper design and selection of the attenuation of the attenuator 410, and the gains, nonlinearity, and Taylor series expansion coefficients of the first, second, third and fourth amplifiers 402, 404, 406 and 408. Additionally, the amplifiers shown in FIG. 20 can be replaced by any other nonlinear device, such as mixers, multi-stage amplifiers, and the like, where such nonlinear devices are similarly characterized for gains, nonlinearities, and third-order output intercept point. Further, the embodiment of FIG. 20 may be found preferential in power amplifier applications, where the third amplifier 406 is the high power amplifier.

For the purpose of illustration in FIG. 20, assume the first nonlinear device is provided such that it has a Taylor series expansion describing the output signal (i.e., voltage, etc.) of the first nonlinear device, $y_1$, in terms of an input signal (i.e., voltage, etc.) of the first nonlinear device, $x_1$, as $y_1 = a_0 + a_1 x_1 + a_2 x_1^2 + a_3 x_1^3 + a_4 x_1^4 \ldots$ The second nonlinear device is provided such that it has a Taylor series expansion describing the output signal of the second nonlinear device, $y_2$, in terms of an input signal of the second nonlinear device, $x_2$, as $y_2 = b_0 + b_1 x_2 + b_2 x_2^2 + b_3 x_2^3 + b_4 x_2^4 \ldots$ The third nonlinear device is provided such that it has a Taylor series expansion describing the output signal of the third nonlinear device, $y_3$, in terms of an input signal of the third nonlinear device, $x_3$, as $y_3 = c_0 + c_1 x_3 + c_2 x_3^2 + c_3 x_3^3 + c_4 x_3^4 \ldots$ The fourth nonlinear device is provided such that it has a Taylor series expansion describing the output signal of the fourth nonlinear device, $y_4$, in terms of an input signal of the fourth nonlinear device, $x_4$, as $y_4 = d_0 + d_1 x_4 + d_2 x_4^2 + d_3 x_4^3 + d_4 x_4^4 \ldots$ The ratio, k, is provided such that k equals the ratio of the output (i.e., voltage, etc.) of the attenuator to the input (i.e., voltage, etc.) of the attenuator. Third order nonlinear distortion is substantially reduced and/or canceled by setting most nearly $b_1^3 d_3 + b_3 d_1 + 2a_1 b_2 d_2 k - 2b_1 b_2 d_2 - 2a_1 a_2 d_2 k^2 + 3a_1^2 b_1 d_3 k^2 - 3a_1 b_1^2 d_3 k - a_1^3 d_3 k^3 + 2a_1 a_2 c_2 + a_1^3 c_3 + a_3 c_1 + 2a_2 b_1 d_2 k - a_3 d_1 k = 0$, and such that $b_1 d_1 + a_1 c_1 - a_1 d_1 k \neq 0$ so that the desired linear output is not canceled. Similarly, second order nonlinear distortion is substantially reduced and/or canceled by setting $b_2 d_1 + a_1^2 c_2 - b_1^2 d_2 + 2a_1 b_1 d_2 k + a_2 c_1 - a_1^2 d_2 k^2 - a_2 d_1 k = 0$, and such that $b_1 d_1 + a_1 c_1 - a_1 d_1 k \neq 0$ so that the desired linear output is not canceled.

As taught by the other methods and apparatus of the present invention, an input coupling means may be used in FIG. 20 to split the input signal into a first and second coupled signal, said second coupled signal in-phase and attenuated relative to the first coupled signal, with the first coupled signal applied as input to the first nonlinear device 402, and the second coupled signal applied as input to the second nonlinear device 404. In addition, subtractor 414 in FIG. 20 may be replaced by a second coupling means, the second coupling means combining the output signal of the third nonlinear device 406 with a 180-degree phase-shifted and attenuated version of the output signal of the fourth nonlinear device 408. Similarly, subtractor 412 may replaced with a third coupling means. As taught by the other methods and apparatus of the present invention, after such modifications the third order intermodulation components are substantially reduced and/or canceled in the final output signal 434 by proper design and selection of the coupling coefficients of the aforementioned input coupling means, second coupling means, third coupling means, the attenuation of the attenuator 410, and the gains, nonlinearity, and intercept points of the first, second, third and fourth nonlinear devices 402, 404, 406 and 408.

As taught by other embodiments of the present invention, adaptive control means may be added to the apparatus embodiment of FIG. 20 to adaptively adjust the gain, phase, and nonlinearity of the first, second, third, and fourth nonlinear devices, and adjust the attenuation of the attenuator, based on feedback to the adaptive control means from the final output signal, or alternatively based on feedback from more advantageous signal points in larger systems, such as bit error rate signals and the like.

FIG. 21 illustrates a flow diagram of a method 950 for substantially reducing and/or canceling nonlinear distortion, in accordance with an embodiment of the present invention. In the first step 952, an input signal is transmitted to an input coupling means that splits the input signal into first and second in-phase coupled signals. As is well known in the art, the coupling means can be readily designed using unequal power dividers, resistive networks, and the like. At step 954, the first coupled signal is transmitted to a first nonlinear device, such as an amplifier, having a Taylor series expansion describing the output signal (i.e., voltage, etc.) of the first nonlinear device, $y_i$, in terms of an input signal (i.e., voltage, etc.) of the first nonlinear device, $x_i$, as $y_1 = a_0 + a_1 x_1 + a_2 x_1^2 + a_3 x_1^3 + a_4 x_1^4 \ldots$ At step 956, the second coupled signal is transmitted to a second nonlinear device, such as an amplifier, having a Taylor series expansion describing the output signal (i.e., voltage, etc.) of the second nonlinear device, $y_2$ in terms of an input signal (i.e., voltage, etc.) of the second nonlinear device, $x_2$, as $y_2 = b_0 + b_1 x_2 + b_2 x_2^2 + b_3 x_2^3 + b_4 x_2^4 \ldots$, and with substantially equal time delay and phase in the first and second nonlinear devices. As is well known in the art, nonlinear devices, such as amplifiers, can be designed for varying levels of distortion, including third order nonlinear distortion, by adjusting current and voltage bias levels of components within the device and by selection or design of the components used within the device. As is also well known in the art, signal currents can be used in place of signal voltages.

At step 958, the output signal of the first nonlinear device is transmitted to an attenuator with output signal, k, times attenuator input signal, and, at step 960, the output signal of the second nonlinear device is subtracted from attenuator output to form a difference signal.

At step 962, the output of the first nonlinear device is transmitted to third nonlinear device, such as an amplifier, with Taylor series expansion describing the output signal (i.e., voltage, etc.) of the third nonlinear device, $y_3$, in terms of an input signal (i.e., voltage, etc.) of the third nonlinear device, $x_3$, as $y_3 = c_0 + c_1 x_3 + c_2 x_3^2 + c_3 x_3^3 + c_4 x_3^4 \ldots$ At step 964, the difference signal is transmitted to a fourth nonlinear device, such as an amplifier, with Taylor series expansion describing the output signal (i.e., voltage, etc.) of the fourth nonlinear device, $y_4$, in terms of an input signal (i.e., voltage, etc.) of the fourth nonlinear device, $x_4$, as $y_4 = d_0 + d_1 x_4 + d_2 x_4^2 + d_3 x_4^3 + d_4 x_4^4 \ldots$, and with substantially equal time delay and phase in the third and fourth nonlinear devices.

At step 966, the output of the fourth nonlinear device is subtracted from the output of the third nonlinear device to form a difference signal (i.e., voltage, etc.) defined as the final output signal, substantially reducing and/or canceling nonlinear distortion. The relationship between the attenuator, first, second, third, and fourth nonlinear devices being defined such that third order nonlinear distortion is substantially reduced and/or canceled by setting most nearly $b_1^3 d_3 + b_3 d_1 + 2 a_1 b_2 d_2 k - 2 b_1 b_2 d_2 - 2 a_1 a_2 d_2 k^2 + 3 a_1^2 b_1 d_3 k^2 - 3 a_1 b_1^2 d_3 k - a_1^3 d_3 k^3 + 2 a_1 a_2 c_2 + a_1^3 c_3 + a_3 c_1 + 2 a_2 b_1 d_2 k - a_3 d_1 k = 0$, and such that $b_1 d_1 + a_1 c_1 - a_1 d_1 k \neq 0$ so that the desired linear output is not canceled. Alternatively, second order nonlinear distortion is canceled and eliminated by most nearly setting $b_2 d_1 + a_1^2 c_2 - b_1^2 d_2 + 2 a_1 b_1 d_2 k + a_2 c_1 - a_1^2 d_2 k^2 - a_2 d_1 k = 0$, and such that $b_1 d_1 + a_1 c_1 - a_1 d_1 k \neq 0$ so that the desired linear output is not canceled.

As is well known by one practiced in the art, method 950 can be modified to perform the same function for other order nonlinearities by similarly canceling Taylor series terms associated with order n distortion products. Additionally, the steps of phase adjusting, bias adjusting and amplitude adjusting can be added to method 950 to provide fine resolution adjustment to more precisely cancel the undesired nonlinear distortions.

As taught by other embodiments of the present invention, the step of adjusting, adaptively, the gain, phase, and nonlinearity of the first, second, third, and fourth nonlinear devices may alternatively comprise the method detailed by FIG. 21. Additionally, the step of adjusting, adaptively, the attenuation of the attenuator may comprise the method detailed by FIG. 21. The adaptive adjustment will typically occur based on feedback to the adaptive control means from the final output signal, or alternatively based on feedback from more advantageous signal points in larger systems, such as bit error rate signals and the like.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An apparatus for substantially reducing nonlinear distortion, the apparatus comprising:
   a first nonlinear device having an input and an output;
   a coupling means having an input in communication with the output of the first nonlinear device and first and second in-phase outputs;
   a second nonlinear device having an input in communication with the first in-phase output of the coupling means and an output, wherein the input of the second nonlinear device is independent of the input of the first nonlinear device; and
   a subtractor having a first input in communication with the output of the second nonlinear device, a second input in communication with the second in-phase output of the coupling means and an output, wherein the subtractor subtracts the output signal of the second nonlinear device from the second in-phase output of the coupler to generate a final output.

2. The apparatus of claim 1, wherein the first nonlinear device further comprises a first amplifier and the second nonlinear device further comprises a second amplifier.

3. The apparatus of claim 1, wherein the first nonlinear device further comprises a first mixer and the second nonlinear device further comprises a second mixer.

4. The apparatus of claim 1, wherein the first nonlinear device further comprises an amplifier and the second nonlinear device further comprises a diode.

5. The apparatus of claim 1, wherein predetermined nonlinearities an substantially reduced in the final output signal by predetermined selection of a gain of the first nonlinear device, a gain of the second nonlinear device, a nonlinearity of the first nonlinear device, a nonlinearity of the second nonlinear device and selection of the coupling means.

6. The apparatus of claim 1, wherein the first nonlinear device is provided to define a Taylor series expansion describing an output signal, $y_1$, in terms of an input signal, $x_1$, as $y_1 = a_0 + a_1 x_1 + a_2 x_1^2 + a_3 x_1^3 + a_4 x_1^4 \ldots$, the second nonlinear is provided to define a Taylor series expansion describing an output signal, $y_2$, in terms of an input signal, $x_2$, as $y_2 = b_0 + b_1 x_2 + b_2 x_2^2 + b_3 x_2^3 + b_4 x_2^4 \ldots$, and the ratio the first in-phase coupled signal to the second in-phase coupled being k.

7. The apparatus of claim 6, wherein signals $x_1$, $x_2$, $y_1$, and $y_2$ are voltages.

8. The apparatus of claim 6, wherein signals $x_1$, $x_2$, $y_1$, and $y_2$ are currents.

9. The apparatus of claim 6, wherein third order nonlinearities are substantially reduced by setting, k in the apparatus such that most nearly $a_3 - a_3 b_1 k - 2 a_1 a_2 b_2 k^2 - a_1^3 b_3 k^3 = 0$, and such that $a_1 - a_1 b_1 k$ does not equal zero.

10. The apparatus of claim 6, wherein second order nonlinearities are substantially reduced by setting, k, in the apparatus such that most nearly $a_2 - a_2 b_1 k - a_1^2 b_2 k^2 = 0$, and such that $a_1 - a_1 b_1 k$ does not equal zero.

11. A method for substantially reducing nonlinear distortion in an apparatus, the method comprising the steps of:
   processing an input signal at a first nonlinear device, the first nonlinear device having a Taylor series expansion describing an output signal, $y_1$, in terms of an input signal, $x_1$, as $y_1 = a_0 + a_1 x_1 + a_2 x_1^2 + a_3 x_1^3 + a_4 x_1^4 \ldots$;
   splitting, at a coupling means, an output signal of the first nonlinear device into first and second in-phase coupled signals;

processing the first in-phase coupled signal at a second nonlinear device, the second nonlinear device having a Taylor series expansion describing output signal, $y_2$, in terms of an input signal, $x_2$, as $y_2=b_0+b_1x_2+b_2x_2^2+b_3x_2^3+b_4x_2^4\ldots$; and subtracting an output signal of the second nonlinear device from the second in-phase coupled signal to yield an output difference signal, wherein the output difference signal has substantially reduced nonlinear distortion.

12. The method of claim 11, wherein signals $x_1$, $x_2$, $y_1$, and $y_2$ are voltages.

13. The method of claim 11, wherein signals $x_1$, $x_2$, $y_1$, and $y_2$ are currents.

14. The method of claim 11, wherein predetermined nonlinearities are substantially reduced in the final output signal by predetermined selection of a gain of the first nonlinear device, a gain of the second nonlinear device, a nonlinearity of the first nonlinear device, a nonlinearity of the second nonlinear device and selection of the coupling means.

15. The method of claim 11, wherein the ratio of a first in-phase coupled signal to a second in-phase coupled signal, is defined as k and third-order nonlinearities are substantially reduced by setting, k, such that most nearly $a_3-a_3b_1k-2a_1a_2b_2k^2-a_1^3b_3k^3=0$, and such that $a_1-a_1b_1k$ does not equal zero.

16. The method of claim 11, wherein the ratio of a first in-phase coupled signal to a second in-phase coupled signal, is defined as k and second order nonlinearities are substantially reduced by setting, k, such that most nearly $a_2-a_2b_1k-a_1^2b_2k^2=0$, and such that $a_1-a_1b_1k$ does not equal zero.

17. An apparatus for substantially reducing nonlinear distortion, the apparatus comprising:

a first mixer device having an input and an output;

a coupling means having an input in communication with the output of the first mixer device and first and second in-phase outputs;

a second mixer device having an input in communication with the first in-phase output of the coupling means and an output, wherein the input of the second mixer device is independent of the input of the first mixer device; and a subtractor having a first input in communication with the output of the second mixer device, a second input in communication with the second in-phase output of the coupling means and an output, wherein the subtractor subtracts the output signal of the second mixer device from the second in-phase output of the coupler to generate a final output.

18. The apparatus of claim 17, wherein predetermined nonlinearities are substantially reduced in the final output signal by predetermined selection of a gain of the first mixer device, a gain of the second mixer device, a nonlinearity of the first mixer device, a nonlinearity of the second mixer device and selection of the coupling means.

19. The apparatus of claim 17, wherein the first mixer device is provided to define a Taylor series expansion describing an output signal, $y_1$, in terms of an input signal, $x_1$, as $y_1=a_0+a_1x_1+a_2x_1^2+a_3x_1^3+a_4x_1^4\ldots$, the second mixer device is provided to define a Taylor series expansion describing an output signal, $y_2$, in terms of an input signal, $x_2$, as $y_2=b_0+b_1x_2+b_2x_2^2+b^3x_2^3+b_4x_2^4\ldots$, and the ratio the first in-phase coupled signal to the second in-phase coupled being k.

20. An apparatus for substantially reducing nonlinear distortion, the apparatus comprising:

an amplifier device having an input and an output;

a coupling means having an input in communication with the output of the amplifier device and first and second in-phase outputs;

a diode device having an input in communication with the first in-phase output of the coupling means and an output, wherein the input of the diode devices is independent of the input of the amplifier device; and a subtractor having a first input in communication with the output of the diode device, a second input in communication with the second in-phase output of the coupling means and an output, wherein the subtractor subtracts the output signal of the diode device from the second in-phase output of the coupler to generate a final output.

21. The apparatus of claim 17, wherein predetermined nonlinearities are substantially reduced in the final output signal by predetermined selection of a gain of the amplifier device, a gain of the diode device, a nonlinearity of the amplifier device, a nonlinearity of the diode device and selection of the coupling means.

22. The apparatus of claim 17, wherein the amplifier device is provided to define a Taylor series expansion describing an output signal, $y_1$, in terms of an input signal, $x_1$, as $y_1=a_0+a_1x_1+a_2x_1^2+a_3x_1^3+a_4x_1^4\ldots$, the diode device is provided to define a Taylor series expansion describing an output signal, $y_2$, in terms of an input signal, $x_2$, as $y_2=b_0+b_1x_2+b_2x_2^2+b_3x_2^3+b_4x_2^4\ldots$, and the ratio the first in-phase coupled signal to the second in-phase coupled being k.

23. An apparatus for substantially reducing nonlinear distortion, the apparatus comprising:

a first nonlinear device having an input and an output;

a coupling means having an input in communication with the output of the first nonlinear device and first and second in-phase outputs;

a second nonlinear device having an input in communication with the first in-phase output of the coupling means and an ouput; and a subtractor having a first input in communication with the output of the second nonlinear device, a second input in communication with the second in-phase output of the coupling means and an output, wherein the subtractor subtracts the output signal of the second nonlinear device from the second in-phase output of the coupler to generate a final output, the first nonlinear device is provided to define a Taylor series expansion describing an output signal, $y_1$, in terms of an input signal, $x_1$, as $y_1=a_0+a_1x_1+a_2x_1^2+a_3x_1^3+a_4x_1^4\ldots$, the second nonlinear device is provided to define a Taylor series expansion describing an output signal, $y_2$, in terms of an input signal, $x_2$, as $y_2=b_0+b_1x_2+b_2x_2^2+b_3x_2^3+b_4x_2^4$ and the ratio the first in-phase coupled signal to the second in-phase coupled being k.

24. The apparatus of claim 23, wherein signals $x_1$, $x_2$, $y_1$, and $y_2$ are voltages.

25. The apparatus of claim 23, wherein signals $x_1$, $x_2$, $y_1$, and $y_2$ are currents.

26. The apparatus of claim 23, wherein third order nonlinearities are substantially reduced by setting, k, in the apparatus such that most nearly $a_3-a_3b_1k-2a_1a_2b_2k^2-a_1^3b_3k^3=0$, and such that $a_1-a_1b_1k$ does not equal zero.

27. The apparatus of claim 23, wherein second order nonlinearities are substantially reduced by setting, k, in the apparatus such that most nearly $a_2-a_2b_1k-a_1^2b_2k^2=0$, and such that $a_1-a_1b_1k$ does not equal zero.

* * * * *